US012581956B2

(12) United States Patent　　(10) Patent No.:　US 12,581,956 B2
Lan et al.　　　　　　　　　　　(45) Date of Patent:　　Mar. 17, 2026

(54) THROUGH MOLDING CONTACT ENABLED EMI SHIELDING

(71) Applicant: QUALCOMM Incorporated, San Diego, CA (US)

(72) Inventors: Je-Hsiung Lan, San Diego, CA (US); Jonghae Kim, San Diego, CA (US); Ranadeep Dutta, Del Mar, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 528 days.

(21) Appl. No.: 18/067,565

(22) Filed: Dec. 16, 2022

(65) Prior Publication Data

US 2024/0203895 A1　　Jun. 20, 2024

(51) Int. Cl.
*H01L 23/552*　　(2006.01)
*H01L 21/48*　　(2006.01)
*H01L 21/56*　　(2006.01)
*H01L 23/00*　　(2006.01)
*H01L 23/498*　　(2006.01)
*H01L 25/065*　　(2023.01)

(52) U.S. Cl.
CPC ........ *H01L 23/552* (2013.01); *H01L 21/4857* (2013.01); *H01L 21/486* (2013.01); *H01L 21/563* (2013.01); *H01L 21/566* (2013.01); *H01L 21/568* (2013.01); *H01L 23/49822* (2013.01); *H01L 24/16* (2013.01); *H01L 25/0655* (2013.01); *H01L 23/49816* (2013.01); *H01L 2224/16225* (2013.01); *H01L 2924/14215* (2013.01); *H01L 2924/1811* (2013.01); *H01L 2924/1815* (2013.01); *H01L*

*2924/182* (2013.01); *H01L 2924/186* (2013.01); *H01L 2924/2027* (2013.01); *H01L 2924/3025* (2013.01)

(58) Field of Classification Search
None
See application file for complete search history.

(56) References Cited

U.S. PATENT DOCUMENTS 9,673,151　B2 *　6/2017　Chiu ................... H01L 21/4853
10,475,985　B2 *　11/2019　Bhushan ................ H01L 24/20
10,790,238　B2 *　9/2020　Jun ..................... H01L 23/3121
(Continued)

FOREIGN PATENT DOCUMENTS

CN　　　110752163 A　　2/2020
KR　　　20180021336 A　　3/2018

OTHER PUBLICATIONS

International Search Report and Written Opinion—PCT/US2023/082125—ISA/EPO—Apr. 9, 2024.

*Primary Examiner* — Long Pham

(74) *Attorney, Agent, or Firm* — Muncy, Geissler, Olds & Lowe, P.C.

(57) ABSTRACT

Disclosed are examples of multi-die modules that includes a die (e.g., a power amplifier) and an adjacent die placed side-by-side and bonded onto a substrate with a mold compound. The die (e.g., a switch or a low noise amplifier) may be double EMI shielded to minimize or even eliminate EMI/noise coupling with the adjacent die (e.g., switch, low noise amplifier, etc.). Another mold compound, which can be thermally conductive, may be provided to improve transfer of heat away from the die and/or the adjacent die.

27 Claims, 22 Drawing Sheets

(56) References Cited

U.S. PATENT DOCUMENTS

| | | | |
|---|---|---|---|
| 2012/0188727 A1* | 7/2012 | Lin | H01L 24/10 |
| | | | 361/728 |
| 2016/0049348 A1 | 2/2016 | Zhao et al. | |
| 2016/0093576 A1 | 3/2016 | Chiu et al. | |
| 2017/0236787 A1* | 8/2017 | Chiu | H01L 23/552 |
| | | | 257/659 |
| 2019/0244907 A1 | 8/2019 | Liao et al. | |
| 2020/0194383 A1* | 6/2020 | Fang | H01L 24/19 |
| 2020/0388579 A1 | 12/2020 | Jun | |
| 2022/0246597 A1 | 8/2022 | Shibata et al. | |

* cited by examiner

415 singulation

415

415

425

415

425

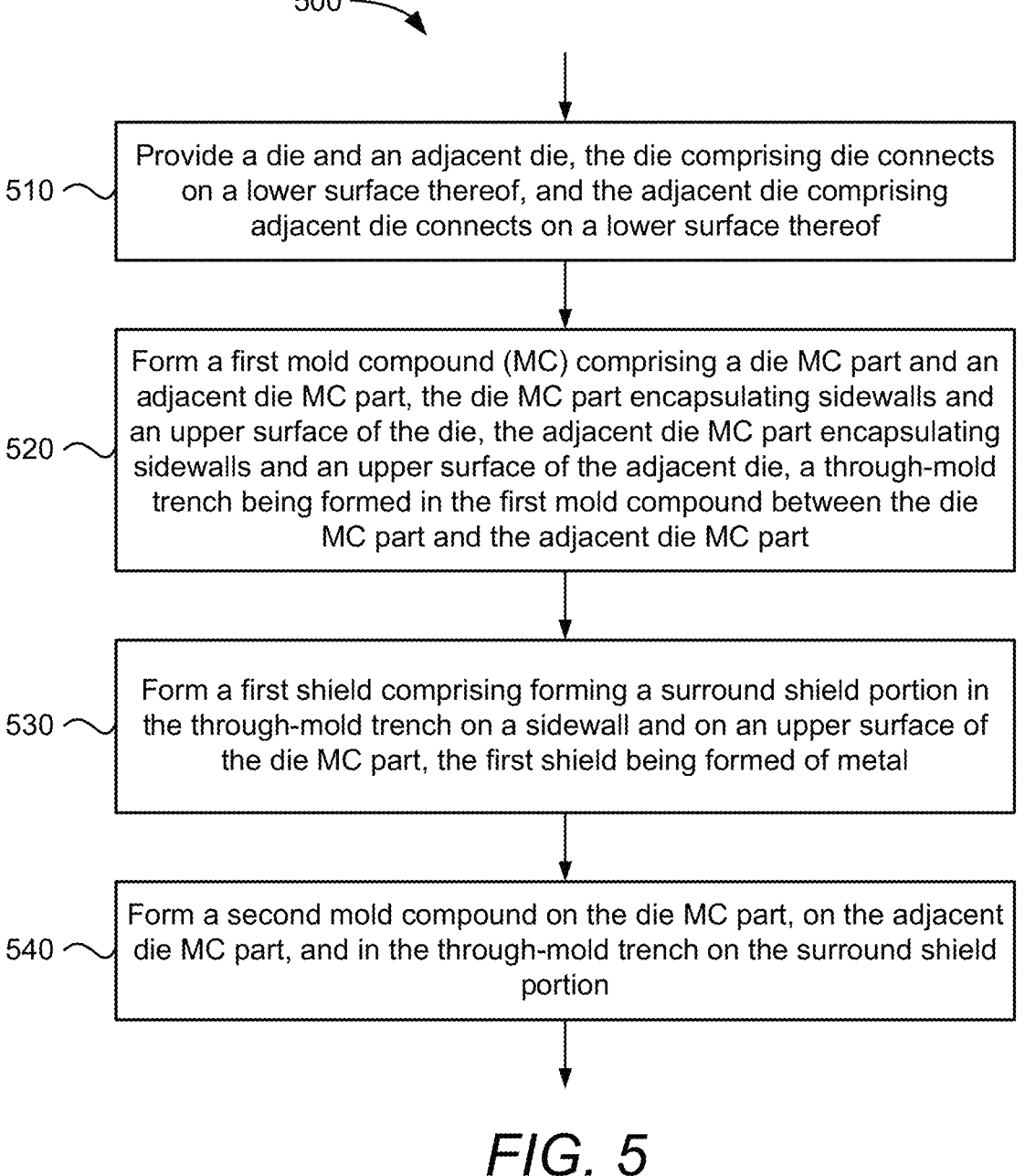

500

510   Provide a die and an adjacent die, the die comprising die connects on a lower surface thereof, and the adjacent die comprising adjacent die connects on a lower surface thereof 520   Form a first mold compound (MC) comprising a die MC part and an adjacent die MC part, the die MC part encapsulating sidewalls and an upper surface of the die, the adjacent die MC part encapsulating sidewalls and an upper surface of the adjacent die, a through-mold trench being formed in the first mold compound between the die MC part and the adjacent die MC part 530   Form a first shield comprising forming a surround shield portion in the through-mold trench on a sidewall and on an upper surface of the die MC part, the first shield being formed of metal 540   Form a second mold compound on the die MC part, on the adjacent die MC part, and in the through-mold trench on the surround shield portion

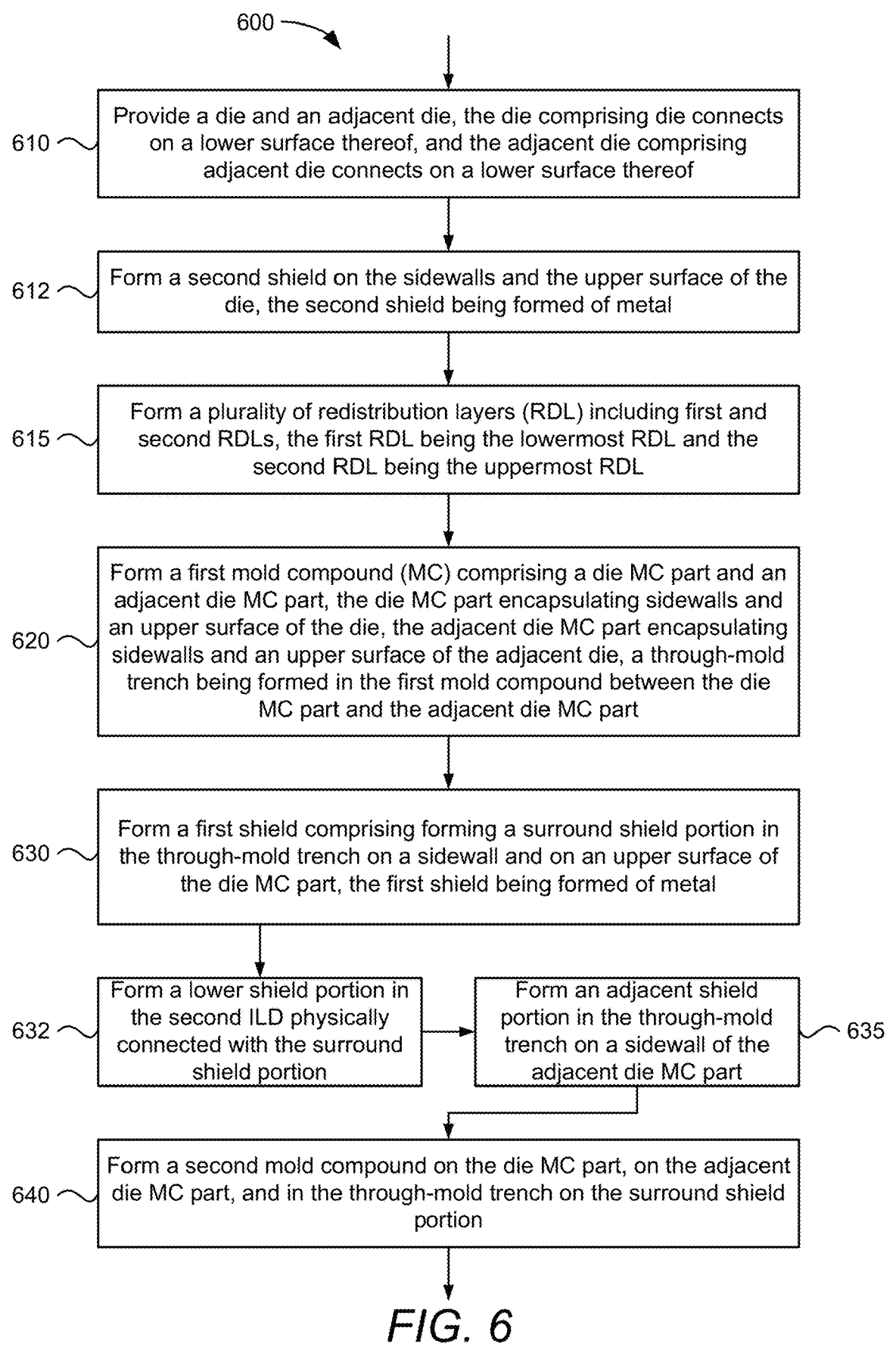

610 — Provide a die and an adjacent die, the die comprising die connects on a lower surface thereof, and the adjacent die comprising adjacent die connects on a lower surface thereof 612 — Form a second shield on the sidewalls and the upper surface of the die, the second shield being formed of metal 615 — Form a plurality of redistribution layers (RDL) including first and second RDLs, the first RDL being the lowermost RDL and the second RDL being the uppermost RDL 620 — Form a first mold compound (MC) comprising a die MC part and an adjacent die MC part, the die MC part encapsulating sidewalls and an upper surface of the die, the adjacent die MC part encapsulating sidewalls and an upper surface of the adjacent die, a through-mold trench being formed in the first mold compound between the die MC part and the adjacent die MC part 630 — Form a first shield comprising forming a surround shield portion in the through-mold trench on a sidewall and on an upper surface of the die MC part, the first shield being formed of metal 632 — Form a lower shield portion in the second ILD physically connected with the surround shield portion 635 — Form an adjacent shield portion in the through-mold trench on a sidewall of the adjacent die MC part 640 — Form a second mold compound on the die MC part, on the adjacent die MC part, and in the through-mold trench on the surround shield portion

*FIG. 6*

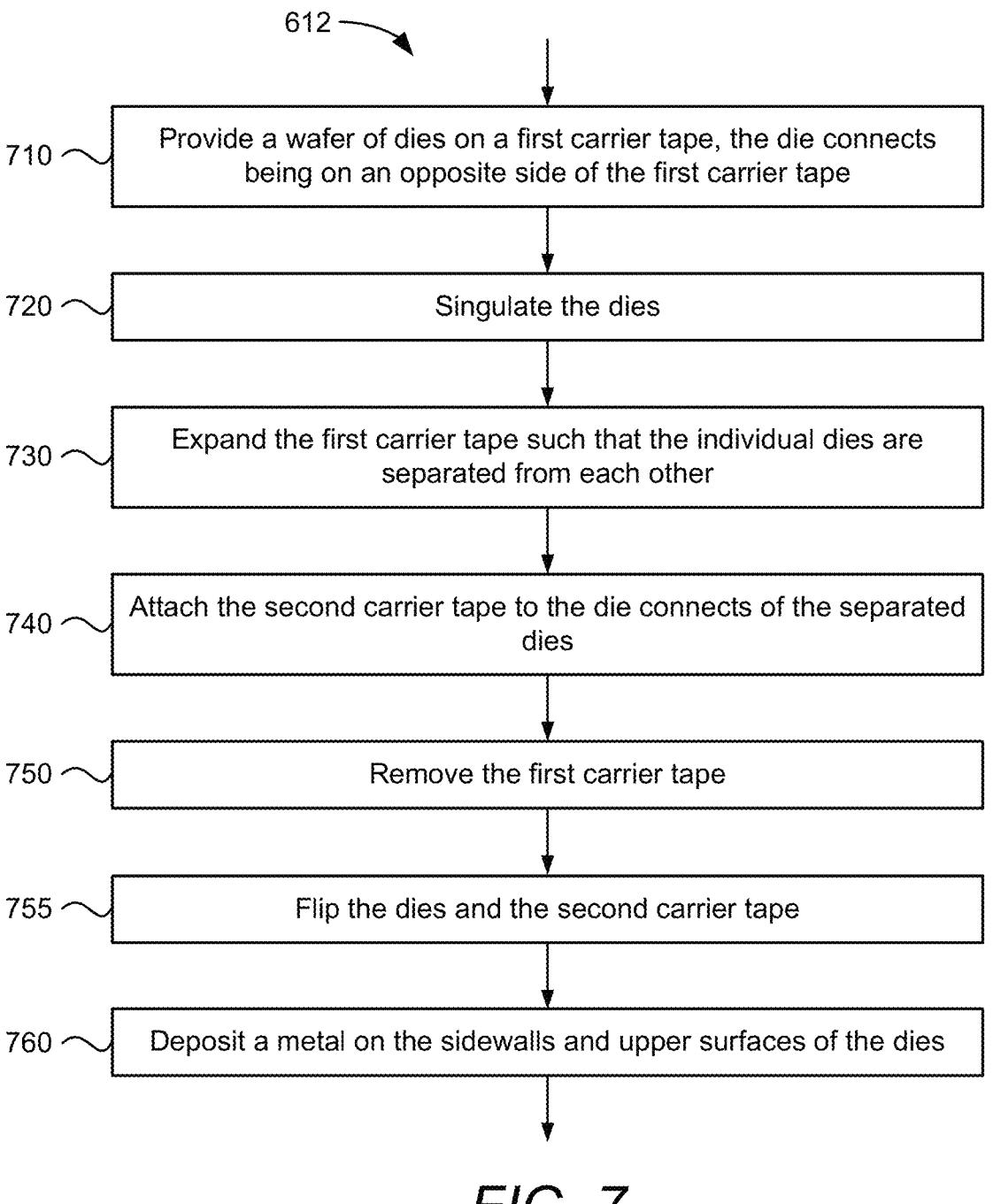

612

710 — Provide a wafer of dies on a first carrier tape, the die connects being on an opposite side of the first carrier tape 720 — Singulate the dies 730 — Expand the first carrier tape such that the individual dies are separated from each other 740 — Attach the second carrier tape to the die connects of the separated dies 750 — Remove the first carrier tape 755 — Flip the dies and the second carrier tape 760 — Deposit a metal on the sidewalls and upper surfaces of the dies

*FIG. 7*

THROUGH MOLDING CONTACT ENABLED EMI SHIELDING

FIELD OF DISCLOSURE

This disclosure relates generally to die packages or modules, and more specifically, but not exclusively, to die packages/modules that includes through molding contact (TMC) enabled electromagnetic interference (EMI) shielding of one or more dies of the package and fabrication techniques thereof.

BACKGROUND

Integrated circuit (IC) technology has achieved great strides in advancing computing power through miniaturization of active components. In current 5G and WiFi6 radio frequency (RF) frontend packages/modules, RFIC chips such as switches (SW), low noise amplifiers (LNA), power amplifiers (PA), filters, etc. are placed side-by-side and flip-chip bonded onto a laminate substrate with mold compound, e.g., for an RF frontend module. Unfortunately, noise-to-signal coupling can occur between the chips.

Accordingly, there is a need for systems, apparatus, and methods that overcome the deficiencies of conventional multi-die modules including the methods, system and apparatus provided herein.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

An exemplary multi-die module is disclosed. The multi-die module may comprise a die and an adjacent die. The die may comprise die connects on a lower surface thereof. The adjacent die may comprise adjacent die connects on a lower surface thereof. The multi-die module may also comprise a first mold compound (MC) comprising a die MC part and an adjacent die MC part. The die MC part may encapsulate sidewalls and an upper surface of the die. The adjacent die MC part may encapsulate sidewalls and an upper surface of the adjacent die. A through-mold trench may be formed in the first mold compound between the die MC part and the adjacent die MC part. The multi-die module may further comprise a first shield, which may comprise a surround shield portion formed in the through-mold trench on a sidewall and on an upper surface of the die MC part. The first shield may be formed of metal. The multi-die module may yet comprise a second mold compound formed on the die MC part, on the adjacent die MC part, and in the through-mold trench on the surround shield portion, the second mold compound.

A method of fabricating an exemplary multi-die module is disclosed. The method may comprise providing a die and an adjacent die. The die may comprise die connects on a lower surface thereof. The adjacent die may comprise adjacent die connects on a lower surface thereof. The method may also comprise forming a first mold compound (MC) comprising a die MC part and an adjacent die MC part. The die MC part may encapsulate sidewalls and an upper surface of the die. The adjacent die MC part may encapsulate sidewalls and an upper surface of the adjacent die. A through-mold trench may be formed in the first mold compound between the die MC part and the adjacent die MC part. The method may further comprise forming a first shield, which may comprise a surround shield portion formed in the through-mold trench on a sidewall and on an upper surface of the die MC part. The first shield may be formed of metal. The method may yet comprise forming a second mold compound on the die MC part, on the adjacent die MC part, and in the through-mold trench on the surround shield portion, the second mold compound.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

FIGS. 5-7 illustrate flow charts of example methods of manufacturing a multi-die module in accordance with at one or more aspects of the disclosure.

Figure 1:
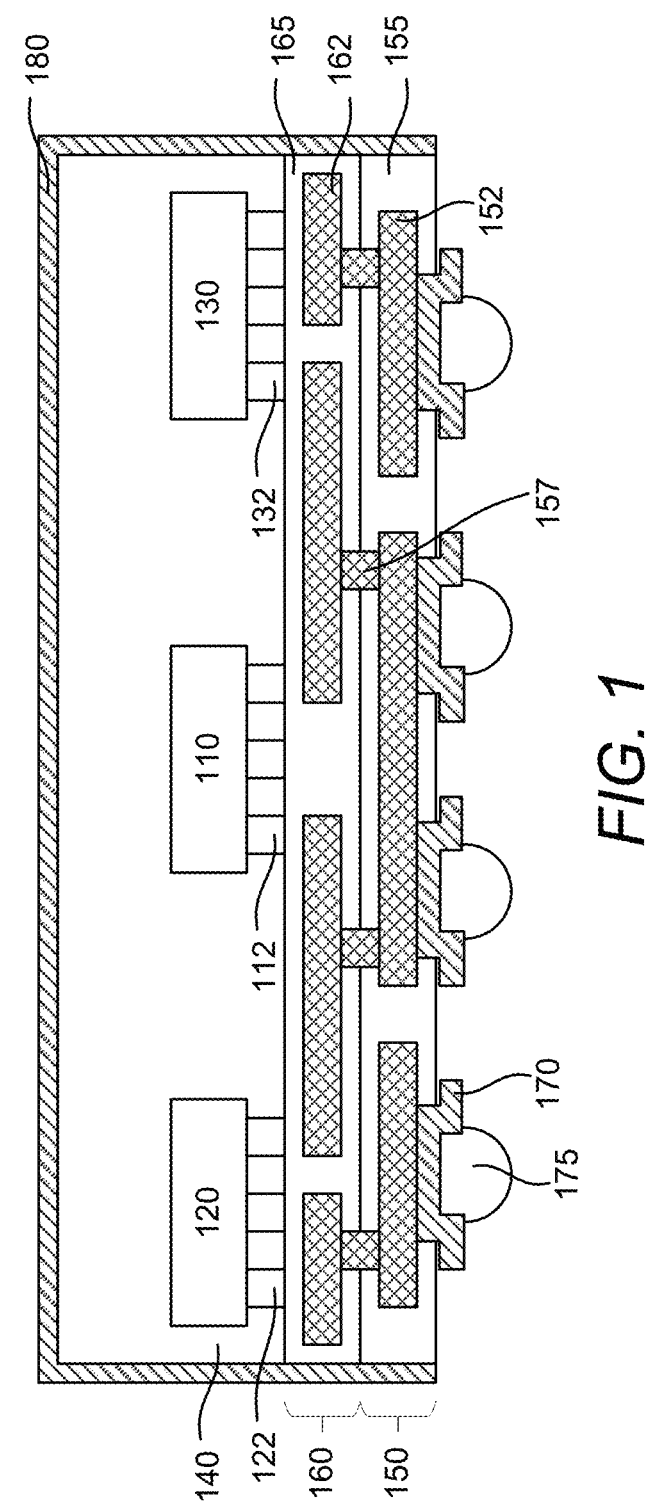
FIG. 1 illustrate an example of a conventional multi-die module.

Other objects and advantages associated with the aspects disclosed herein will be apparent to those skilled in the art based on the accompanying drawings and detailed description. In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary embodiments. In such instances, internal details of the known, conventional component structures and/or portions of operations may be omitted to help avoid potential obfuscation of the concepts illustrated in the illustrative embodiments disclosed herein.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

As indicated above, in current 5G and WiFi6 radio frequency frontend (RFFE) packages/modules, RFIC chips such as switches (SW), low noise amplifiers (LNA), power amplifiers (PA), filters, etc. are placed side-by-side and flip-chip bonded onto a laminate substrate with mold compound, e.g., for an RFFE module. Unfortunately, noise-to-signal coupling can occur between the chips.

FIG. 1 illustrates an example of a conventional multi-die module 100. The multi-die module 100 includes first, second, and third dies 110, 120 and 130. The first die 110 (e.g., a power amplifier (PA)) may be in the middle and the second and third dies 120, 130 (e.g., switch, low noise amplifier (LNA)) may be adjacent to the first die 110. Thus, the first die 110 may simply be referred to as the die 110 and the second and/or the third die 120, 130 may be referred to as adjacent dies 120, 130. The die 110 comprises die connects 112 on a lower surface thereof, and each of the adjacent dies 120, 130 comprises adjacent die connects 122, 132 on lower surfaces thereof.

A mold compound (MC) 140 encapsulates the die 110 and the adjacent dies 120, 130. Multiple redistribution layers (RDLs) 150, 160 are formed on a lower surface of the MC 140, and on lower surfaces of the die connects 112 and the adjacent die connects 122, 132. The first RDL 150 includes first metal layers 152 formed in first interlayer dielectric (ILD) 155, and the second RDL 160 includes second metal layers 162 formed in second ILD 165. The first and second metal layers 152, 162 are coupled through RDL vias 157. Underbump metallizations (UBM) 170 and solder balls 175 allows the multi-die module 100 to be connected to devices external to the multi-die module 100.

A module shield 180 covers sides and upper surface of the structure. The module shield 180 minimizes external EMI from entering the multi-die module 100. The module shield 180 also minimizes any EMI generated, e.g., by the die 110 from escaping so that the devices external to the module shield 180 experiences less noise.

However, there is no internal shielding provided in the multi-die module 100. Thus, adjacent dies 120, 130 are exposed to EMI generated by the die 110. That is, noise-to-signal coupling can occur when there is no proper EMI shielding between the dies. To reduce the noise coupling, large die-to-die distance may be provided, or a keep out zone (KOZ) may be implemented, in particular for dies close to the PA in the transmit (TX) path.

The EMI/noise coupling issue can become worse when a compact RFFE module is required to be implemented, e.g., in a cellular phone, to accommodate more device components to mean the increased demand of new radio bands, all while keeping the existing legacy bands.

Furthermore, increasing demand of migrating from APT (~32 dBm) to ET solution with HPU PA (~36 dBm) requires very stringent EMI shielding to mitigate antenna interference. This is not achievable with conventional metal cage shielding structure outside the RFFE module.

To address these and other issues of the conventional multi-die module, it is proposed to provide an innovative through-mold contact (TMC) enabled double EMI shielding structure with sidewall shielded devices (e.g., chiplets, chips, dies, etc.) for high performance integrated modules such as RFFE modules. Some of the key features of the innovative structure includes:

EMI shield surrounding the sidewalls of a die (e.g., standalone RF chip) after singulation, e.g., for PA (GaAs, SiGe, SOI, etc.) in the TX path.

TMC with RDL and mold compound of high thermal conductivity placed over the die in the proposed multi-die module.

Enhanced EMI shielding provided by the proposed innovative structure can significantly reduce interference, such as antenna interference. Also, enhanced thermal performance may be provided by the module through heat conduction through the TMC and radiation from the enhanced MC.

Figure 2A:
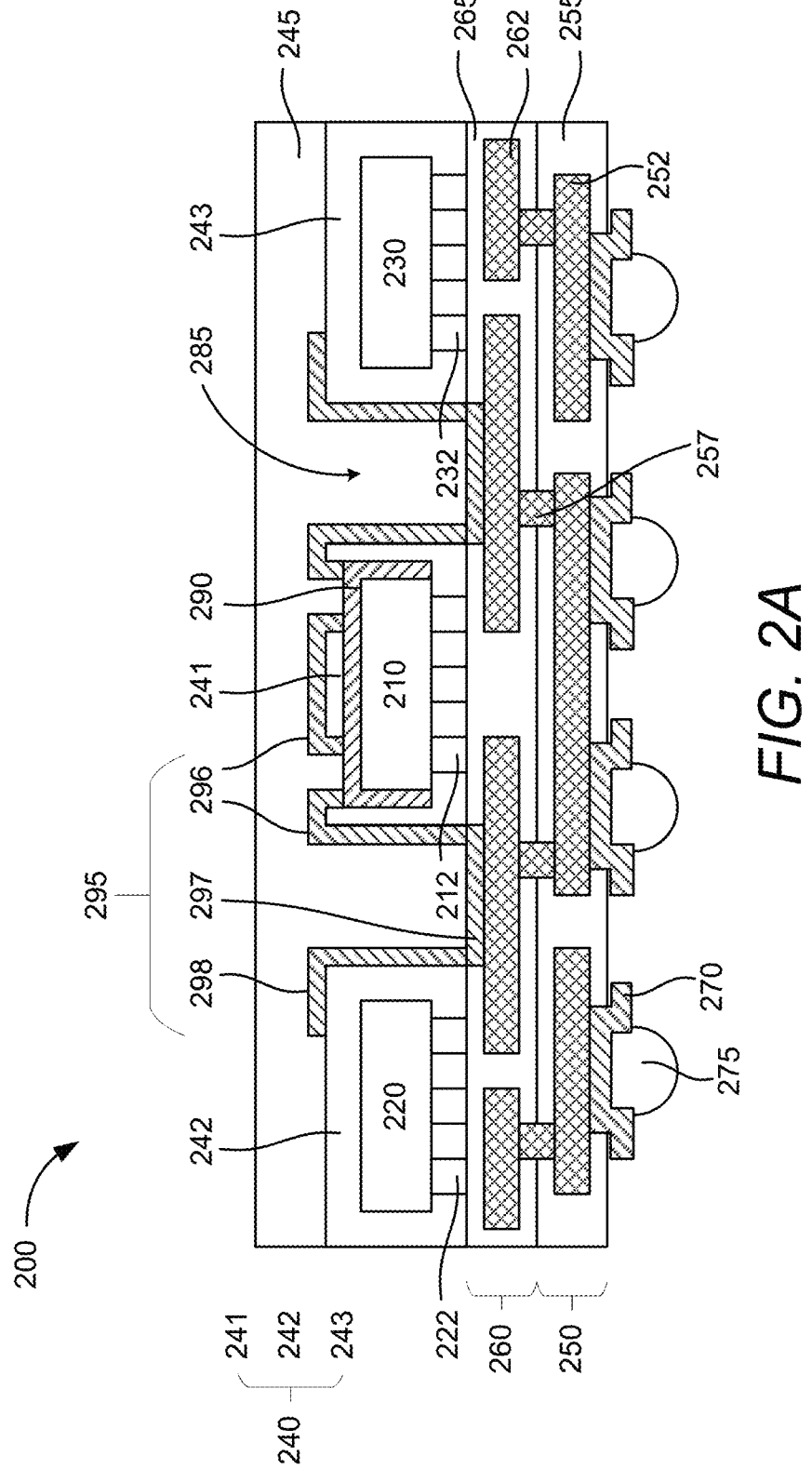
FIGS. 2A and 2B illustrate an example of a multi-die module in accordance with at one or more aspects of the disclosure.
Figure 2B:
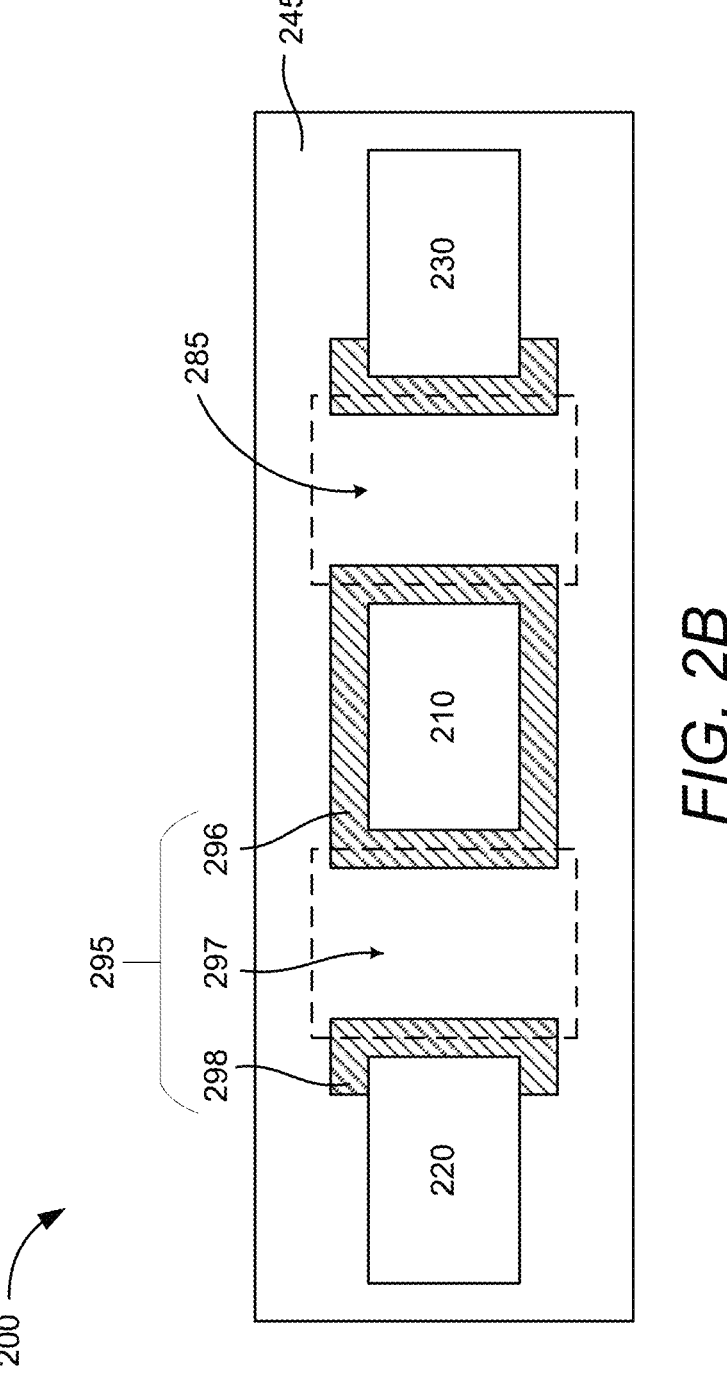

FIGS. 2A and 2B illustrate an example of a multi-die module 200 in accordance with at one or more aspects of the disclosure. FIG. 2A illustrates a cross-sectional view and FIG. 2B illustrates a top view. As seen in FIG. 2A, a multi-die module 200 may include multiple dies 210, 220, 230, a first mold compound 240 surrounding the multiple dies 210, 220, 230, a second mold compound 245 on the first mold compound 240, a plurality of redistribution layers (RDL) 250, 260 formed below the first mold compound 240 and the multiple dies 210, 220, 230, and a plurality of underbump metallizations (UBM) 270 and corresponding interconnects 275 formed below the plurality of RDLs 250, 260.

The multiple may include two or more dies such as such as first, second, and third dies 210, 220, 230. The first die 210 (e.g., a power amplifier (PA)) may be in the middle and the second and third dies 220, 230 (e.g., switch, low noise amplifier (LNA)) may be adjacent to the first die 210. Thus, the first die 210 may simply be referred to as the die 210 and the second and/or the third die 220, 230 may be referred to as adjacent dies 220, 230. Then it may be said that the multi-die module 200 may comprise a die 210 and at least one adjacent die 220, 230. The die 210 may comprise die connects (e.g., die bumps) 212 on a lower surface thereof, and the adjacent die 220, 230 may comprise adjacent die connects 222, 232 (e.g., die bumps) on a lower surface thereof. In an aspect, the term "adjacent dies" may be viewed as referring to two dies with no other intervening die therebetween. For example, in FIG. 2, dies 220, 230 would not be considered to be adjacent dies due to the die 210 therebetween. However, between adjacent dies, it is contemplated that there can be zero or more intervening elements. For example, as seen in FIG. 2A, there can be a surround shield portion 296 and adjacent shield portion 298 (further described below) between the dies 210 and 220.

The first mold compound (MC) 240 may comprise a die MC part 241 and an adjacent die MC part 242, 243. The die MC part 241 may encapsulate sidewalls and an upper surface of the die 210. The adjacent die MC part 242, 243 may encapsulate sidewalls and an upper surface of the adjacent die 220, 230. A through-mold trench 285 may be formed in the first mold compound 240 between the die MC part 241 and the adjacent die MC part 242, 243. The first mold compound 240 may be made from mold compound materials used in conventional multi-die modules such as the mold compound 140 of FIG. 1. Alternatively in addition thereto, the first mold compound 240 may be made from thermally conductive molding materials. Examples include epoxy mold compounds (EMC) filled with fillers such as aluminum nitride (AlN), aluminum oxide ($Al_2O_3$), magnesium oxide (MgO), etc. to enhance its thermal conductivity while still being electrically insulative. EMC with high thermal conductivity and electrical insulation properties is desirable for semiconductor packages.

A first shield 295 may be formed on the first mold compound 240. A through-mold contact (TMC) shield may be an example of the first shield. The first shield 295 may comprise a surround shield portion 296, a lower shield portion 296, and an adjacent shield portion 297. The first shield 295 may be formed of metal. For example, the first shield 295 may be formed from copper (Cu), aluminum (Al), or both. The first shield 295 may be configured to be connected to ground voltage.

The surround shield portion 296 of the first shield 295 may be formed in the through-mold trench 285 on one or both sidewalls of the die MC part 241. In FIG. 2A, the surround shield portion 296 is seen as being on both sidewalls. The surround shield portion 296 may also be formed on an upper surface of the die MC part 241. Thus, the surround shield portion 296 may surround the die 210 on at least three sides (e.g., upper surface and sidewalls), thus providing excellent EMI shielding protection.

The adjacent shield portion 297 may be formed in the through-mold trench 285 on a sidewall of the adjacent die MC part 242, 243. In an aspect, the adjacent shield portion 297 may also be formed at least partially on the upper surface of the adjacent die MC part 242, 243. In other words, the adjacent shield portion 297 may also shield—at least partially—the adjacent die 222, 232 from electromagnetic interferences.

The die 210 itself may be shielded directly with a second shield 290 formed of metal (e.g., Cu, Al, etc.). A die shield may be an example of the second shield 290. The second shield 290 may be formed on the sidewalls and on the upper surface of the die 210. In an aspect, the second shield 290 may be formed directly on the surfaces of the die 210. The second shield 290 may be electrically coupled with the first shield 295. For example, the second shield 290 may be in direct contact with the surround shield portion 296.

The second mold compound 245 may be formed on the die MC part 241, on the adjacent die MC part 242, 243, and in the through-mold trench 285 on the surround shield portion 296 of the first shield 295. The second mold compound 245 may be made from thermally conductive molding materials. In an aspect, a materials with thermal conductivity (TC) of 2 W/m-K or greater may be considered to be thermally conductive. TC of typical EMC is less that 0.5 W/m-K. However, TCs of materials such as AlN (140-180 W/m-K), $Al_2O_3$ (30-40 W/m-K), MgO (20-30 W/m-K), etc. are much higher. Such materials may be used as fillers to EMC to enhance its thermal conductivity. In an aspect, the second mold compound 245 may be made from materials different from the materials of the first mold compound 240. For example, EMC with high TC fillers (e.g., AlN, $Al_2O_3$, MgO nano powders may be mixed.

The plurality of RDLs may include first and second RDLs 250, 260. The first RDL 250 may be the lowermost RDL and the second RDL 260 may be the uppermost RDL. While not shown, there may be one or more intermediate RDLs between the first and second RDLs 250, 260. An upper surface of the first RDL 250 may be in direct contact with a lower surface of the first mold compound 240 (e.g., lower surfaces of the die MC part 241 and of the adjacent die MC part 242, 243) and a lower surface of the second mold compound 245 within the through-mold trench 285.

Each of the plurality of RDLs may comprise one or more layer metals formed in an interlayer dielectric (ILD). For example, the first RDL 250 may comprise one or more first layer metals 252 formed in a first ILD 252. Similarly, the second RDL 260 may comprise one or more second layer metals 262 formed in a second ILD 262. If there are one or more intermediate RDLs, then each intermediate RDL may comprise one or more intermediate layer metals formed in corresponding ILD.

The one or more first layer metals 252 and the one or more second layer metals 262 may provide conductive paths between the die 210 and one or more devices external to the multi-die module 200, e.g., through the UBM 270 and the interconnect 275 (e.g., solder balls). RDL vias 257 may provide the coupling between adjacent RDLs. Note that at least one second metal layer 262 may be electrically coupled to the first shield 295. For example, the conductive path provided through the at least one second metal layer 262 may be a connection to the ground voltage.

In an aspect, the lower shield portion 297 of the first shield 295 may be formed in the second ILD 262. The lower shield portion 297 may be physically connected with the surround shield portion 296. Alternatively or in addition thereto, the lower shield portion 297 may be physically connected with the adjacent shield portion 298. The lower shield portion 297 may be electrically coupled with at least one second layer metal 262. For example, the lower shield portion 297 may be in physical contact with the at least one second layer metal 262.

FIG. 2B illustrates a top view of the multi-die module 200, e.g., at a level of upper surfaces of the die 210 and adjacent dies 220, 230. For simplicity, the first mold compound 240 (die MC part 241, adjacent die MC part 242, 243) are not shown. Note that the surround shield portion 296 (of the first shield 295) may be formed on all sidewalls of the die 210. Also, the adjacent shield portion 298 may be formed on sidewalls of the adjacent dies 220, 230 within the through-mold trench 285. The dashed boxes indicate the locations of the lower shield portion 297 within the second ILD 265.

Figures 3A, 3B:
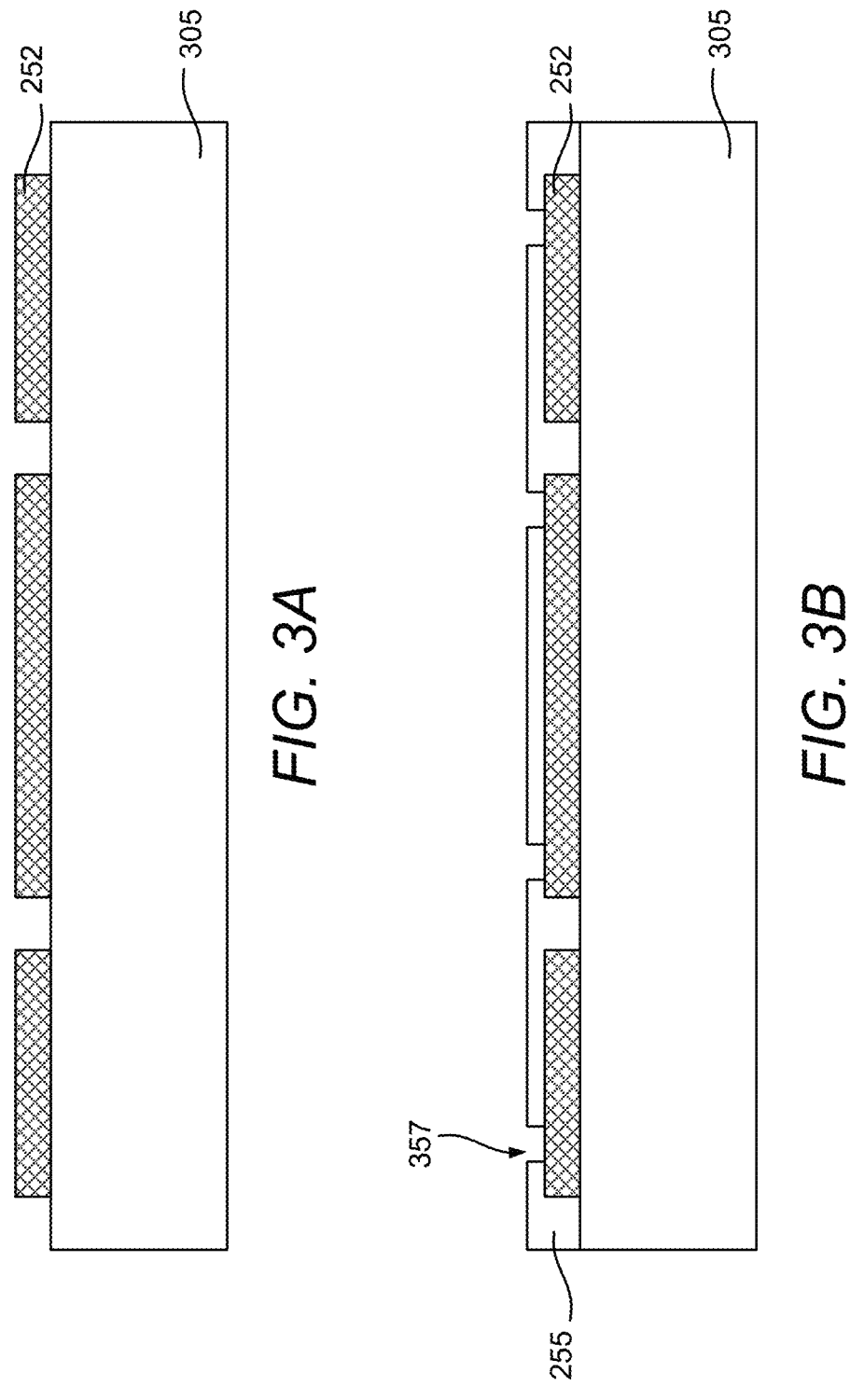
FIGS. 3A-3N illustrate examples of stages of fabricating a multi-die module in accordance with at one or more aspects of the disclosure.
Figures 3C, 3D:
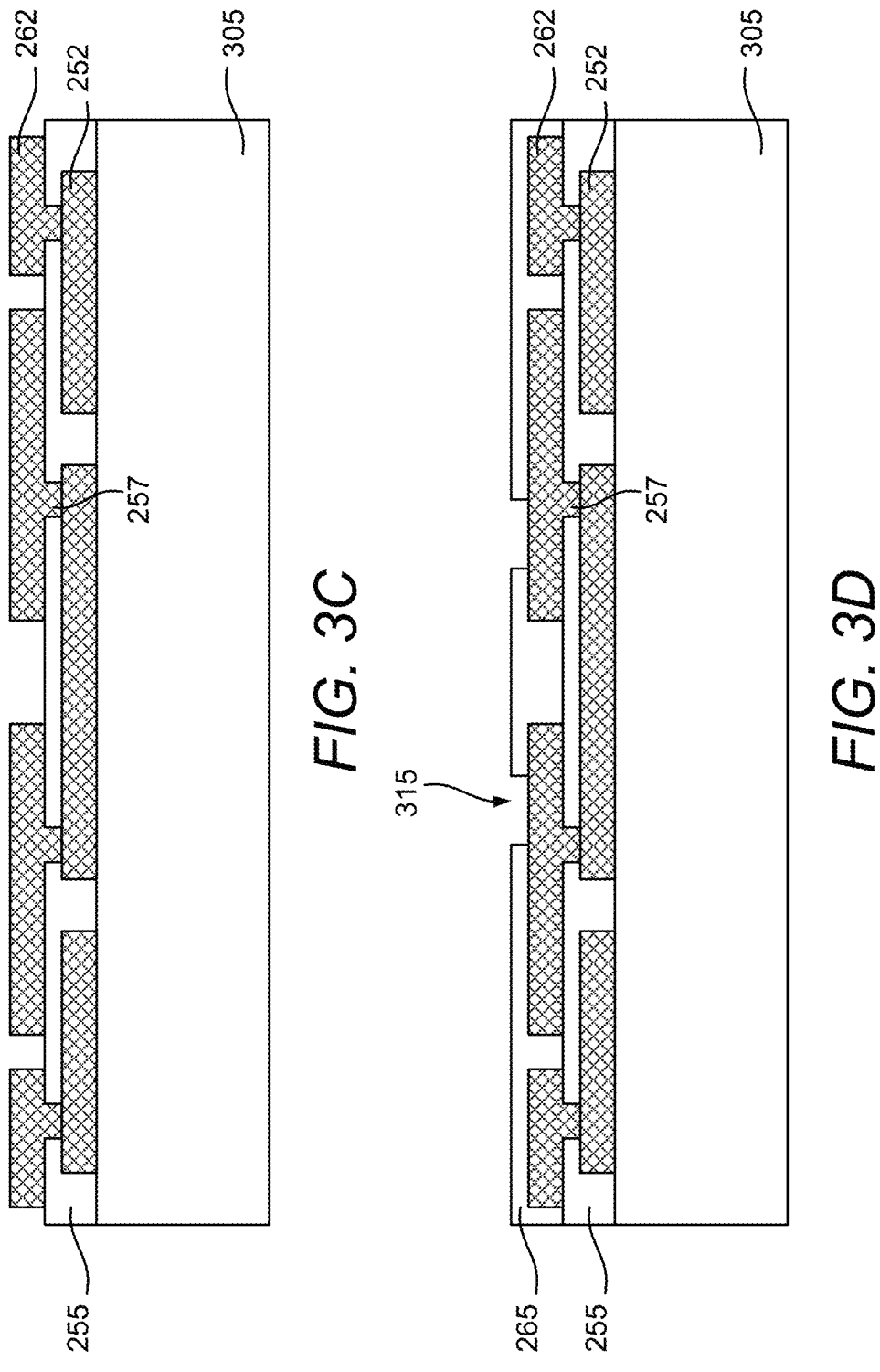
Figure 3E:
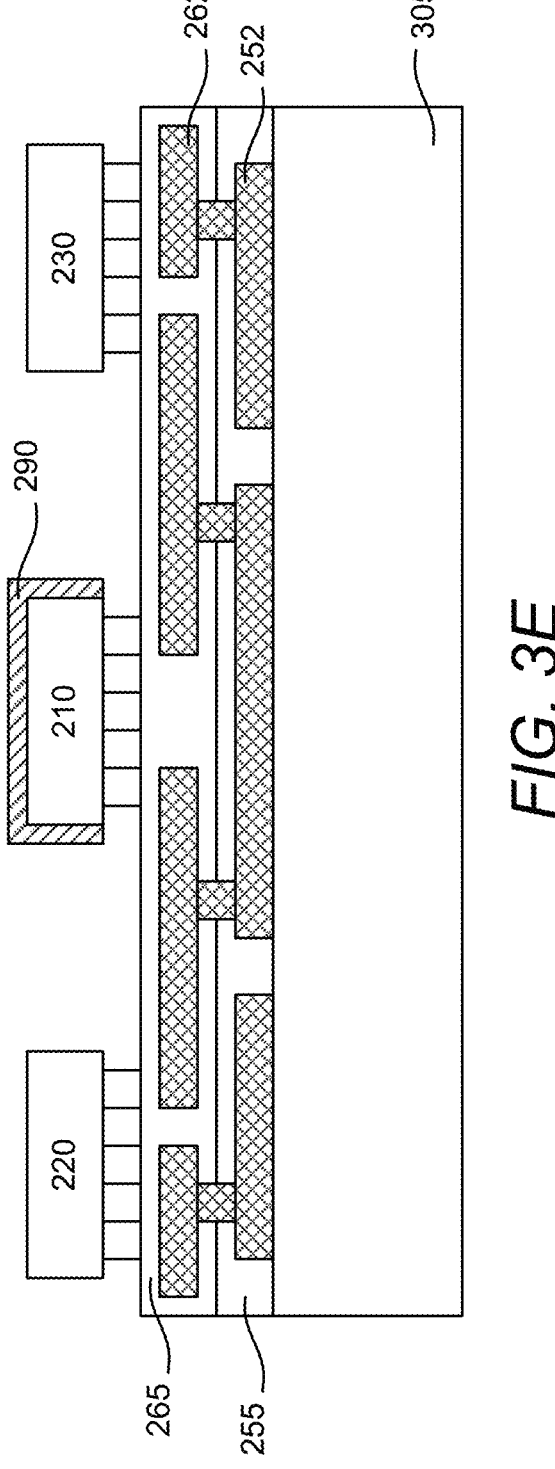
Figure 3F:
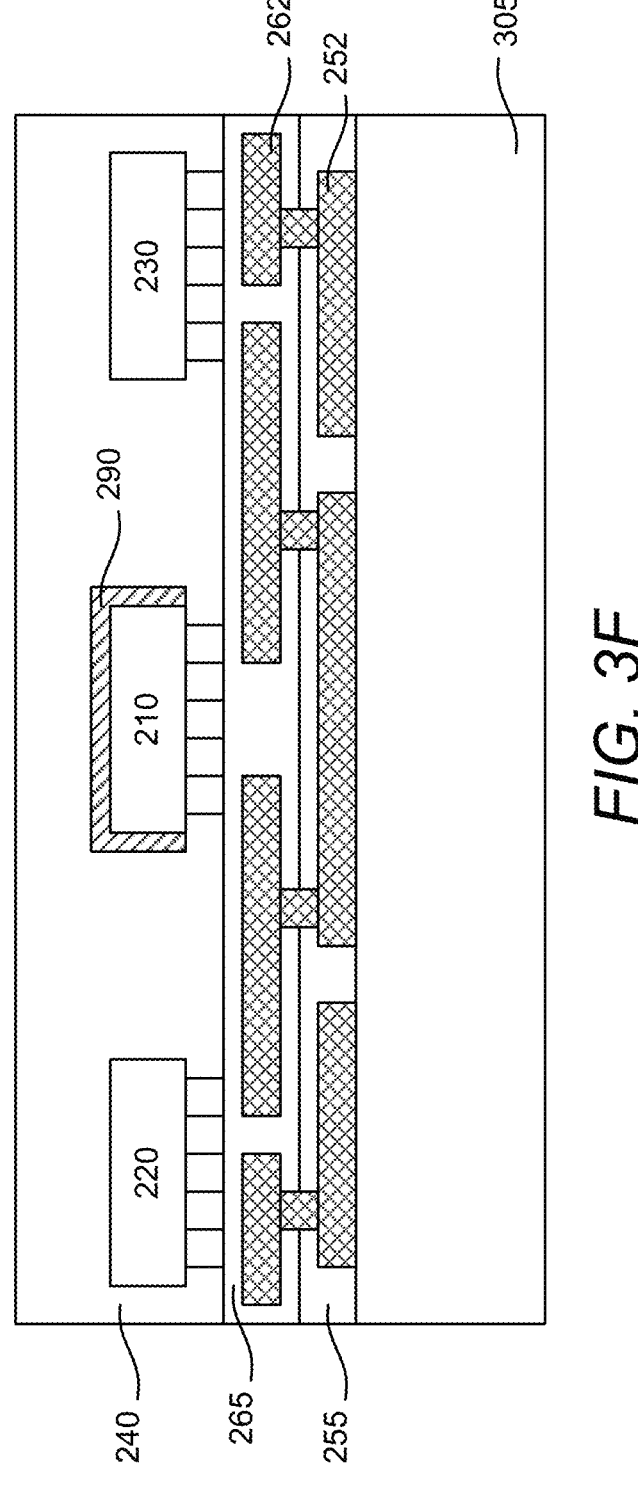
Figure 3G:
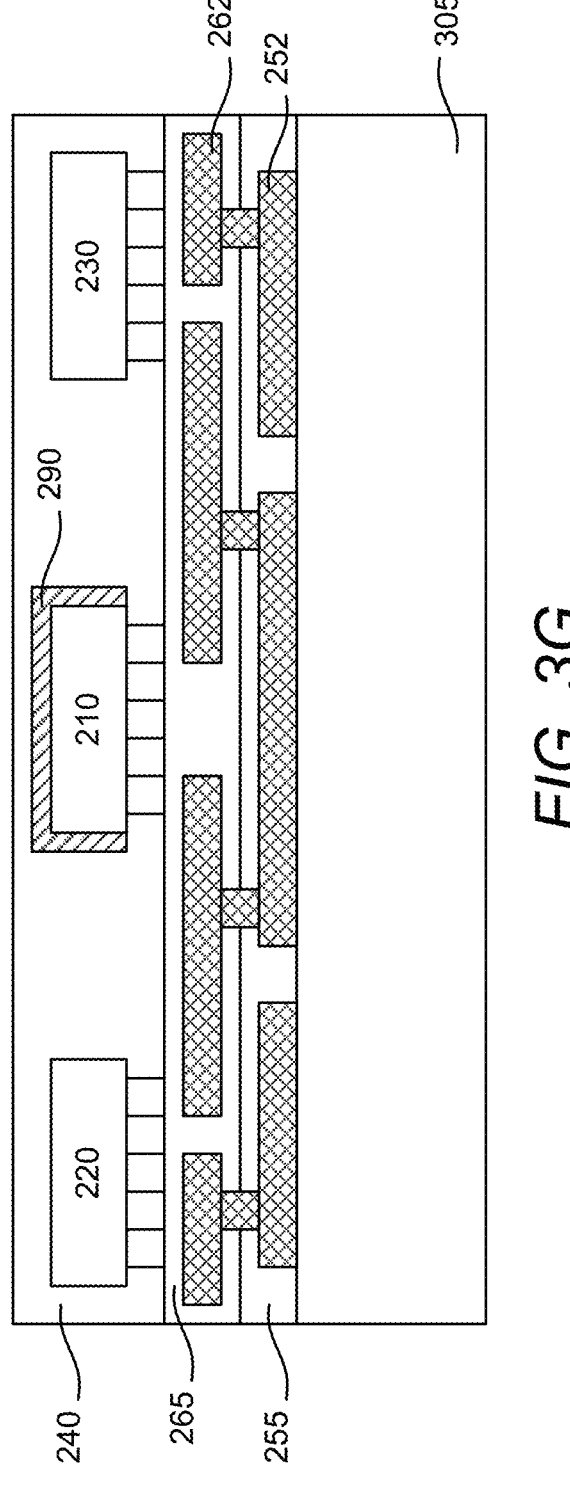
Figure 3H:
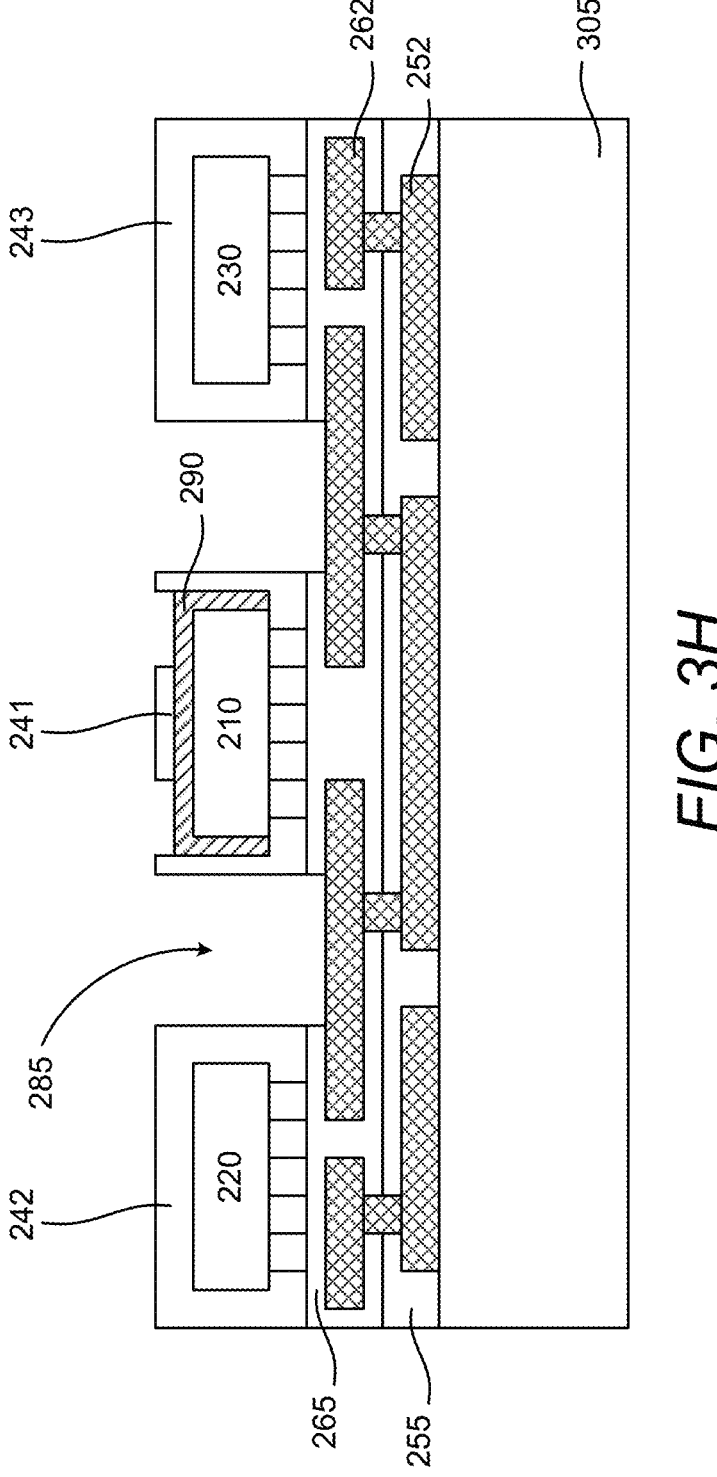
Figure 3I:
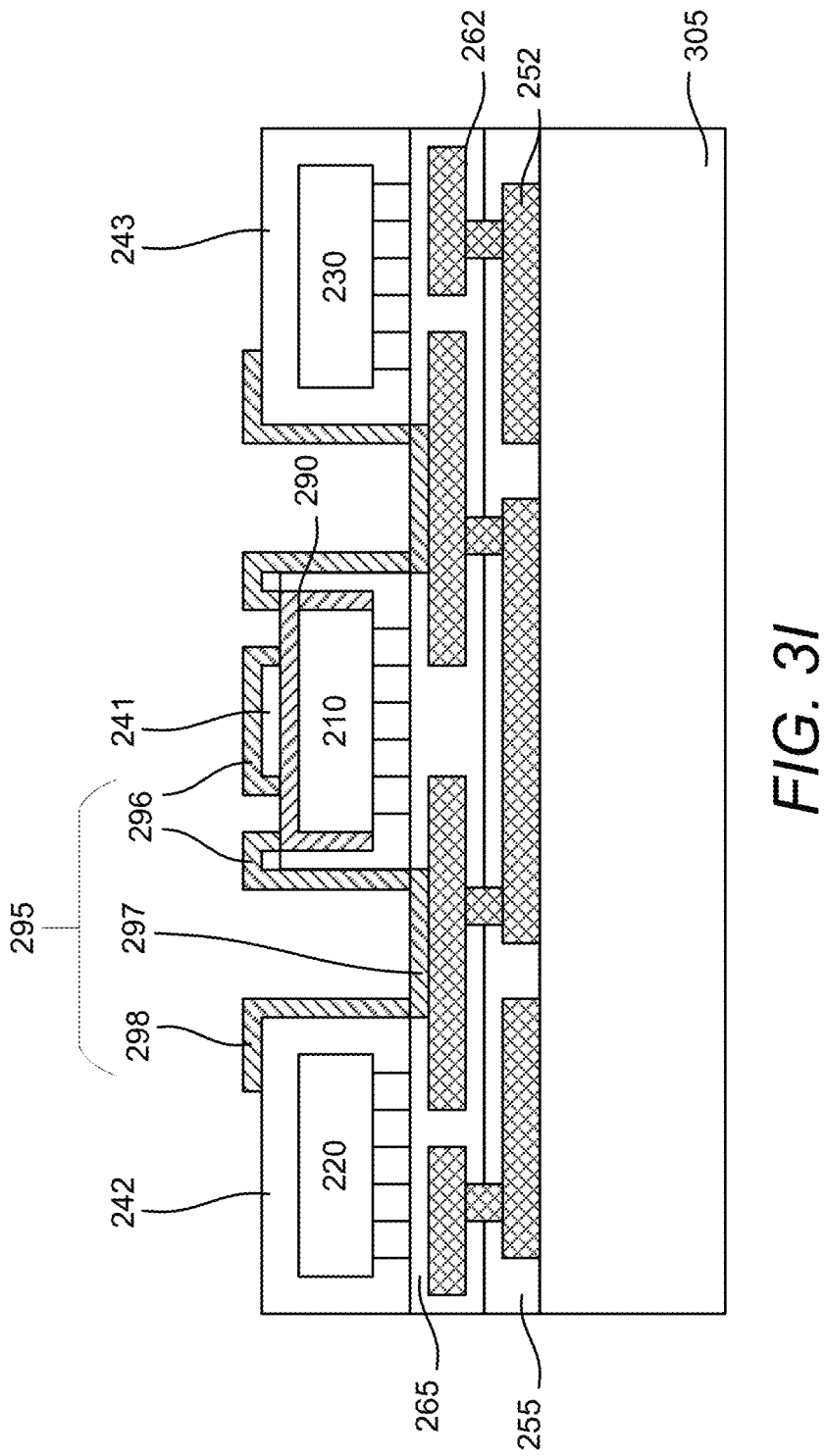
Figure 3J:
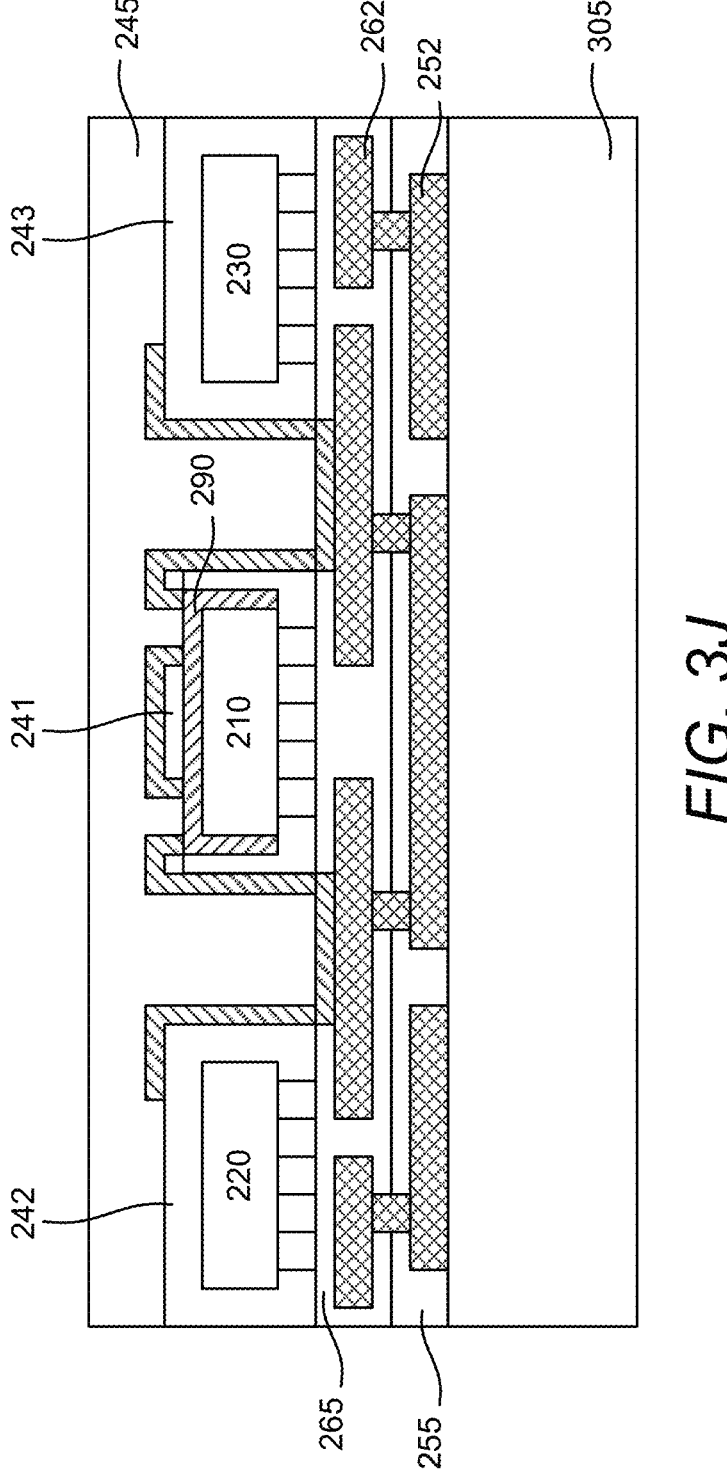
Figure 3K:
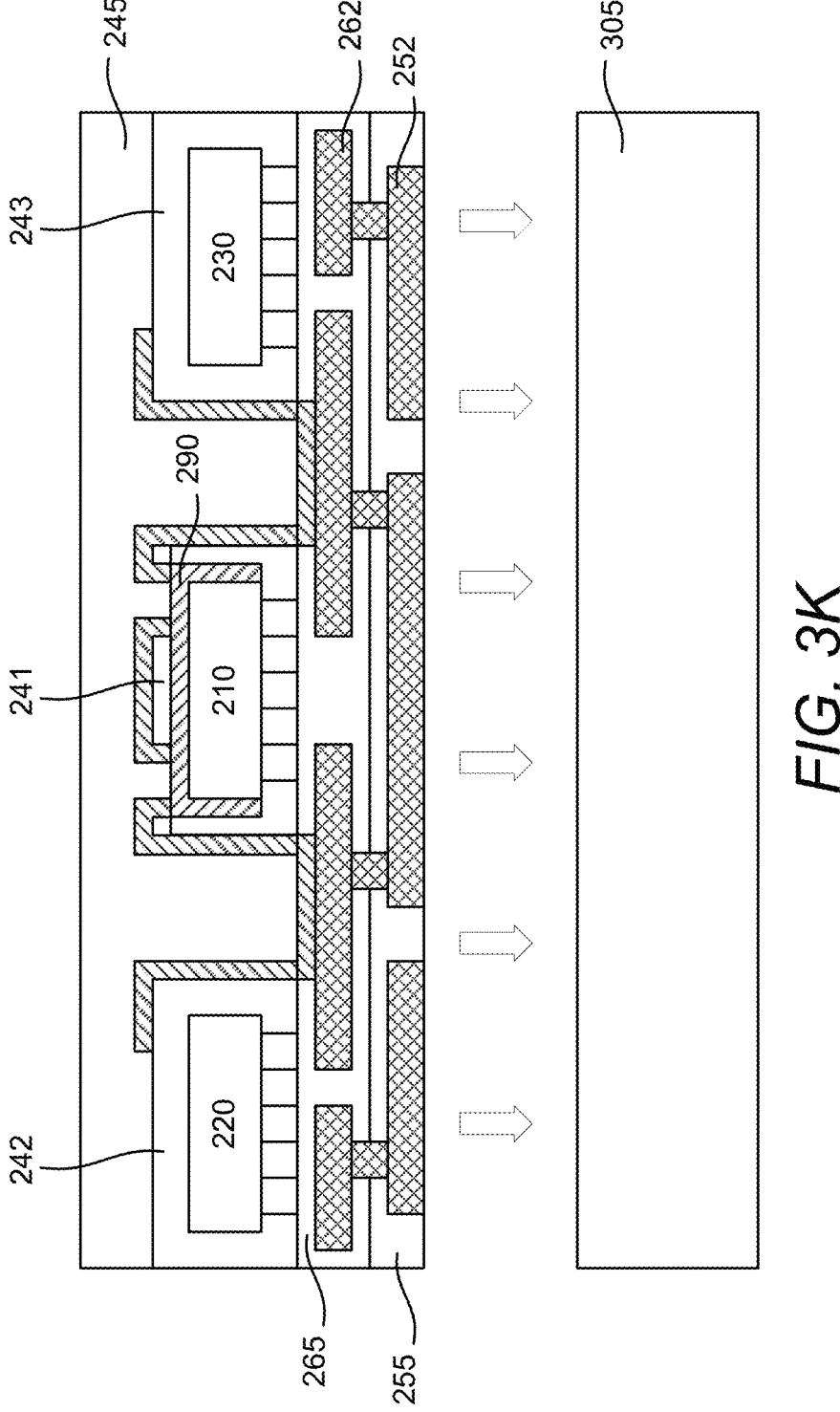
Figure 3L:
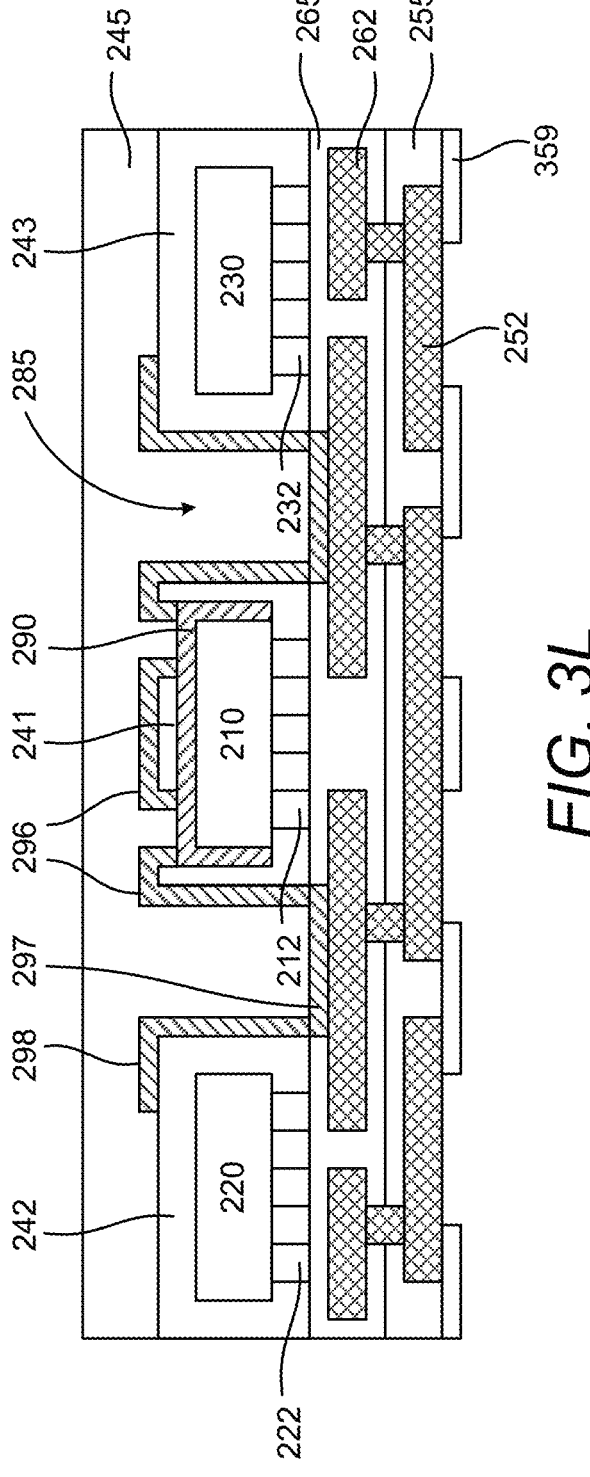
Figure 3M:
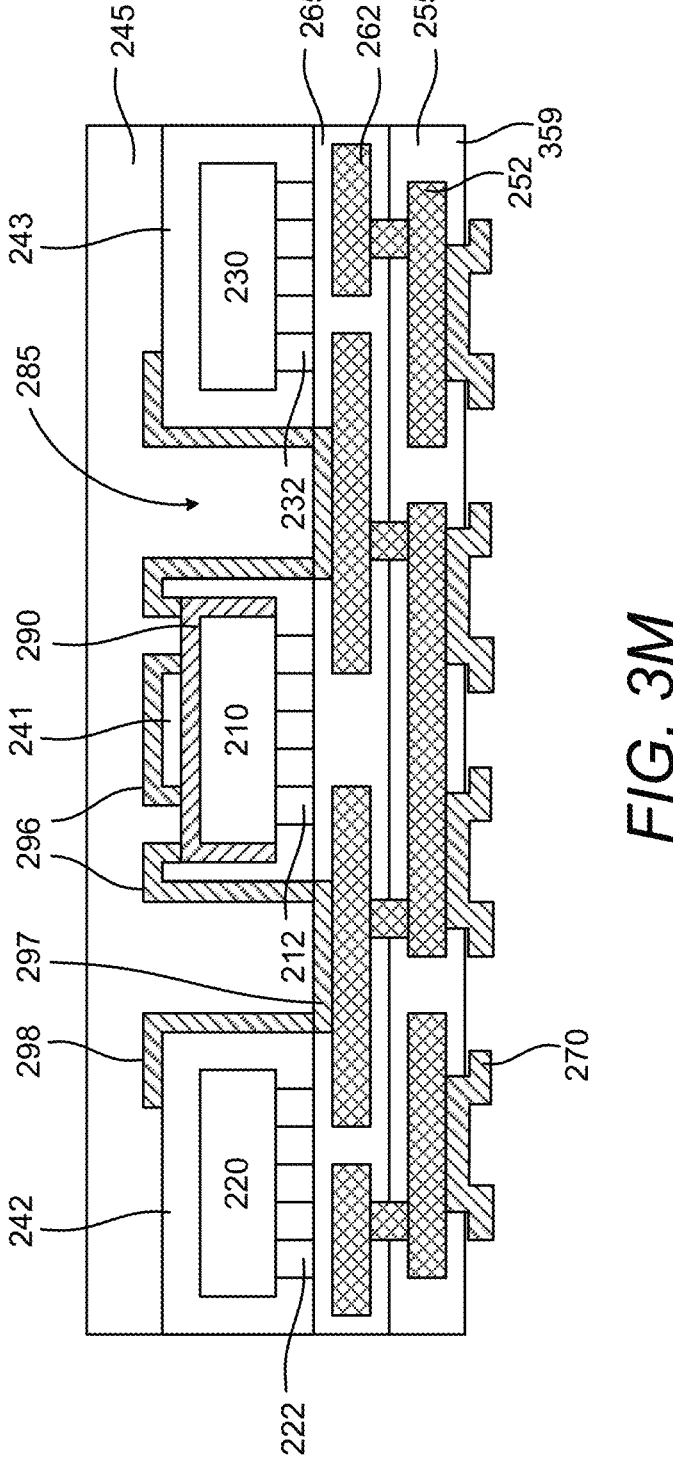
Figure 3N:
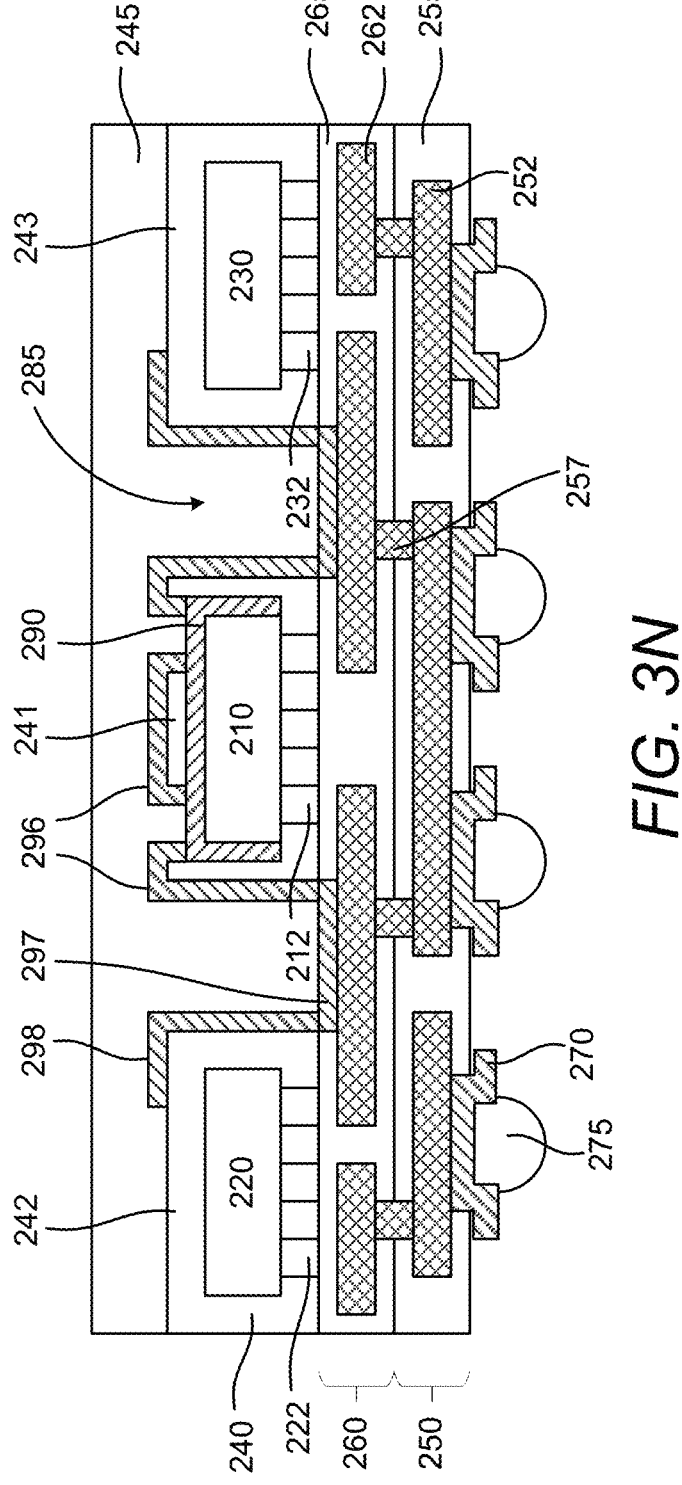

FIGS. 3A-3N illustrate examples of stages of fabricating a multi-die module—such as the multi-die module 200—in accordance with at one or more aspects of the disclosure. These figures may be viewed as illustrating stages in which a module level EMI shielding is provided.

FIG. 3A illustrates a stage in which the first layer metals 252 are formed on a temporary carrier 305. For example, the first layer metals 252 may be plated and/or patterned on the temporary carrier 305.

FIG. 3B illustrates a stage in which the first ILD 255 may be formed on the temporary carrier 305 and on the first layer metals 252. FIG. 3B also illustrates that one or more RDL via openings 357 may be formed in the first ILD 255. The RDL via openings 357 may expose upper surfaces of the first layer metals 252. In an aspect, an ILD material may be spin-coated on the temporary carrier 305 and on the first layer metals 252. Thereafter, the RDL via openings 357 may be formed.

FIG. 3C illustrates a stage in which the RDL vias 257 and the second layer metals 262 may be formed. For example, metal may be plated and/or patterned to form the RDL vials 257 in the RDL via openings 357 and the second layer metals 262 on the first ILD 255.

FIG. 3D illustrates a stage in which the second ILD 265 may be formed on the first ILD 255 and on the second layer metals 262. FIG. 3D also illustrates that one or more die connect openings 315 may be formed in the second ILD 265. The die connect openings 315 may expose upper surfaces of the second layer metals 262. For example, an ILD material may be spin-coated on the first ILD 255 and on the second layer metals 262. Thereafter, the die connect openings 315 may be formed.

While not seen, if there are intermediate RDLs, the process to form each intermediate RDL may follow the process similar to the stages illustrated in FIGS. 3C and 3D with intermediate RDL via openings being formed.

FIG. 3E illustrates a stage in which the die 210 and the adjacent dies 220, 230 are provided on the second RDL 260, e.g., on the second ILD 265. While not specifically shown, it may be assumed that the die 210 and the adjacent dies 220, 230 are coupled to the second layer metals 262 through the die connects 212 and the adjacent die connects 222, 232. In an aspect, shielded die 210 may be provided. That is, the die 210 may already be shielded with the second shield 290.

FIG. 3F illustrates a stage in which the first mold compound 240 may be formed on the second RDL 260. The first mold compound 240 may encapsulate the die 210 as well as the adjacent dies 220, 230.

FIG. 3G illustrates a stage in which the first mold compound 240 may be backgrinded to reduce the vertical thickness thereof. The die 210 and the adjacent dies 220, 230 may remain encapsulated by the first mold compound.

FIG. 3H illustrates a stage in which the through-mold trench 285 is formed through the first mold compound 240. For example, laser ablation may be performed. Note that the process of forming the through-mold trench 285 (e.g., laser ablation) also removes a portion of the second ILD 262 to expose some of the second layer metals 262. When the through-mold trenches 285 are formed, the first mold compound 240 may be split to the die MC part 241 and the adjacent die MC parts 242, 243. In an aspect, the ablation may also remove portions of the die MC part 241 to expose the second shield 290.

FIG. 3I illustrates a stage in which the first shield 295, including the surround shield portion 296, the lower shield portion 297, and the adjacent shield portion 298, is formed. For example, metal (e.g., Cu, Al, etc.) may be plated.

FIG. 3J illustrates in which the second mold compound 245 may be applied on the first mold compound 240 (e.g., on the die MC part 241 and the adjacent die MC part 242, 243) and the first shield 295. For example, thermally conductive mold material may be deposited.

FIG. 3K illustrates a stage in which the temporary carrier 305 may be removed.

FIG. 3L illustrates a stage in which a passivation layer 359 may be formed on a lower surface of the first RDL 250, e.g., on lower surfaces of the first layer metals 252 and the first ILD 255. Note that there may be openings that expose the lower surfaces of the first layer metals 252.

FIG. 3M illustrates a stage in which the UBMs 270 may be formed on the exposed lower surfaces of the first layer metals 252.

FIG. 3N illustrates a stage in which the interconnects 275 (e.g., solder balls) may be formed on the UBMs 270.

FIGS. 4A-4G illustrate examples of stages of providing a die with a second shield—e.g., the die 210 with the second shield 290—in accordance with at one or more aspects of the disclosure. These figures may be viewed as illustrating stages in which a chip/die level EMI shielding is provided.

Figure 4A:
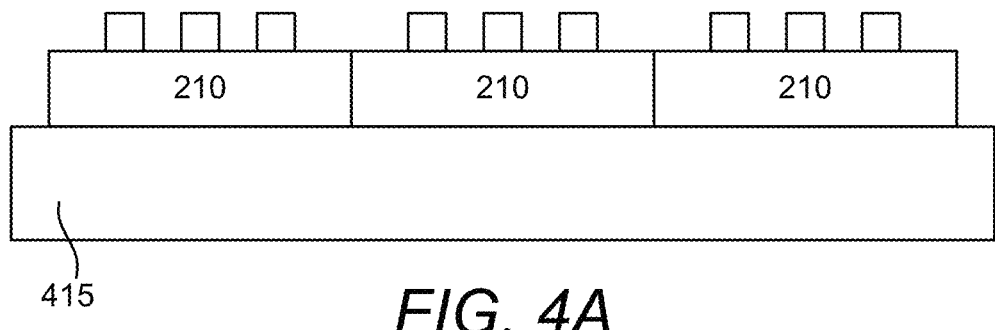
FIGS. 4A-4G illustrate examples of stages of providing a die with a die shield in accordance with at one or more aspects of the disclosure.

FIG. 4A illustrates a stage in which a wafer of dies 210 may be provided on a first carrier tape 415. The die connects (e.g., die bumps) may be on an opposite side of the first carrier tape 415.

Figure 4B:
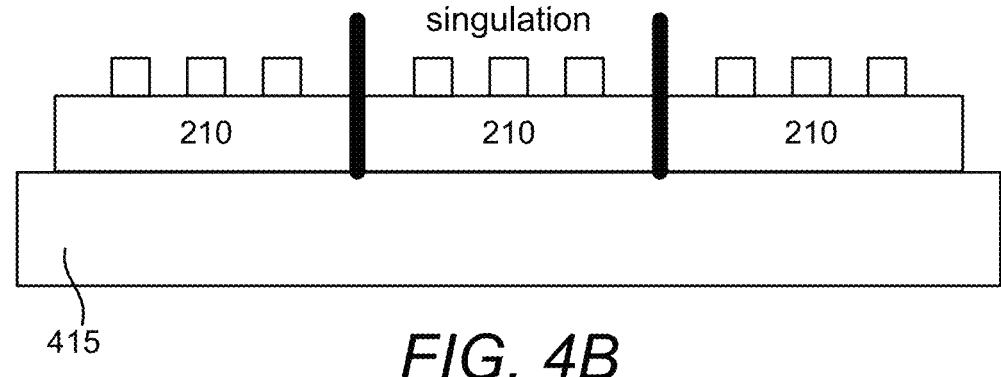

FIG. 4B illustrates a stage in which the dies 210 may be singulated.

Figure 4C:
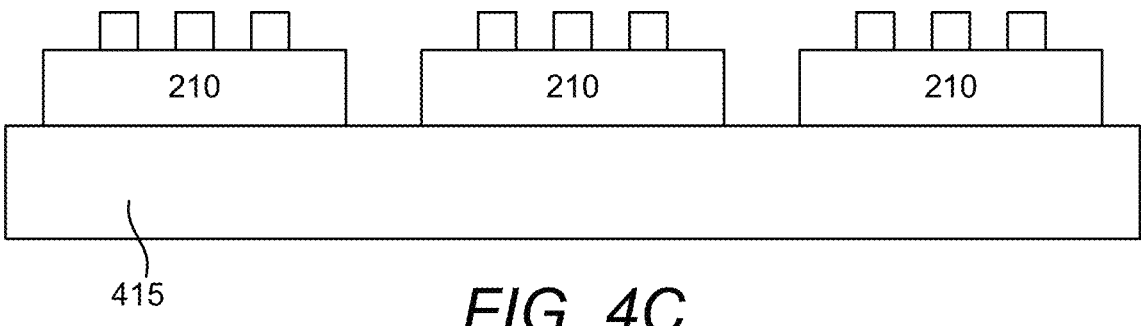

FIG. 4C illustrates a stage in which the first carrier tape 415 may be expanded such that the individual dies are separated from each other.

Figure 4D:
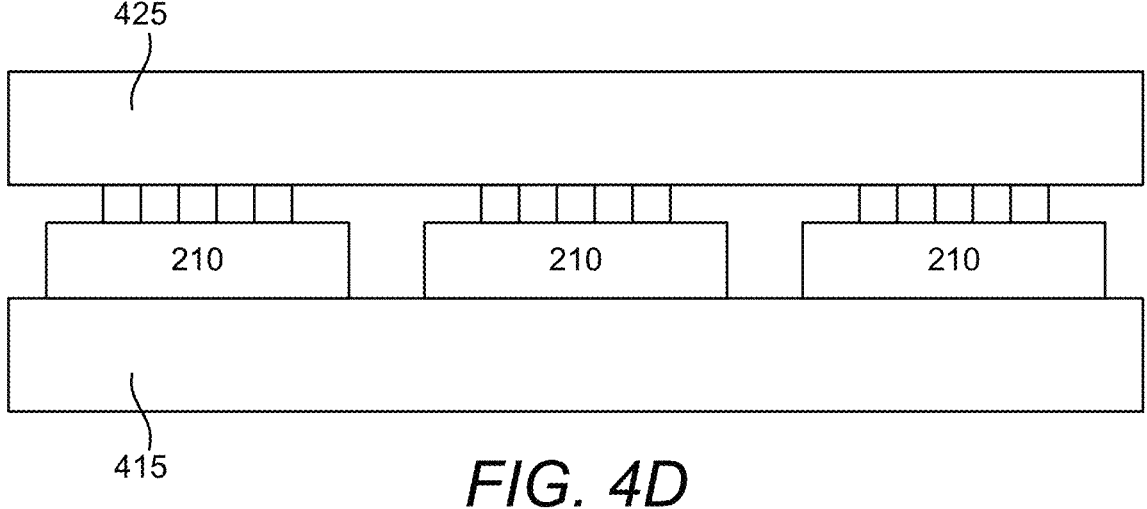

FIG. 4D illustrates a stage in which a second carrier tape 425 may be attached to the die connects of the separated dies 210.

Figure 4E:
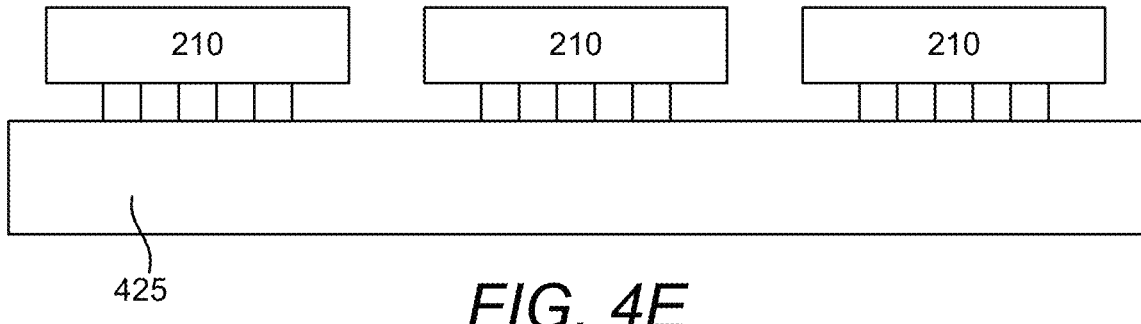

FIG. 4E illustrates a stage in which first carrier tape 415 may be removed, and the dies 210 and the second carrier tape 425 may be flipped.

Figure 4F:
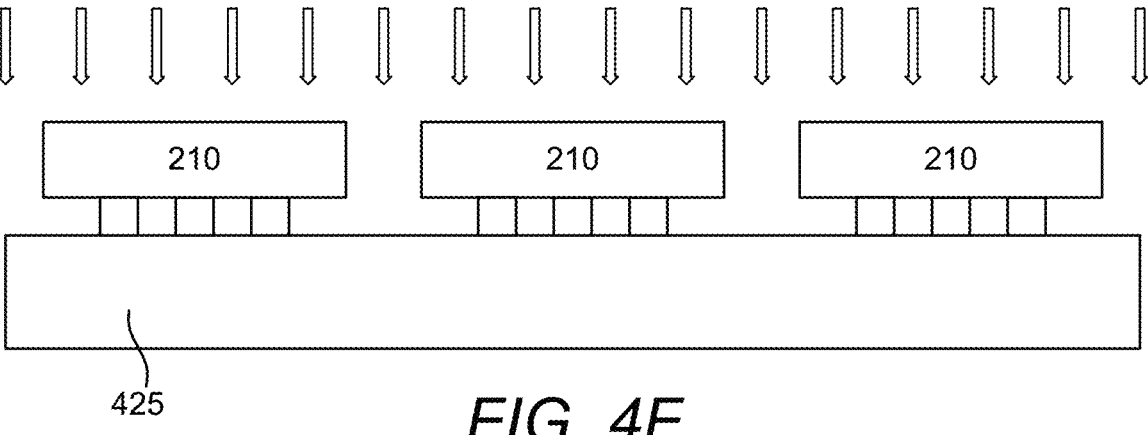

FIG. 4F illustrates a stage in which metal may be deposited on the sidewalls and upper surfaces of the dies 210. For example, a physical vapor deposition (PVD) may be performed.

Figure 4G:
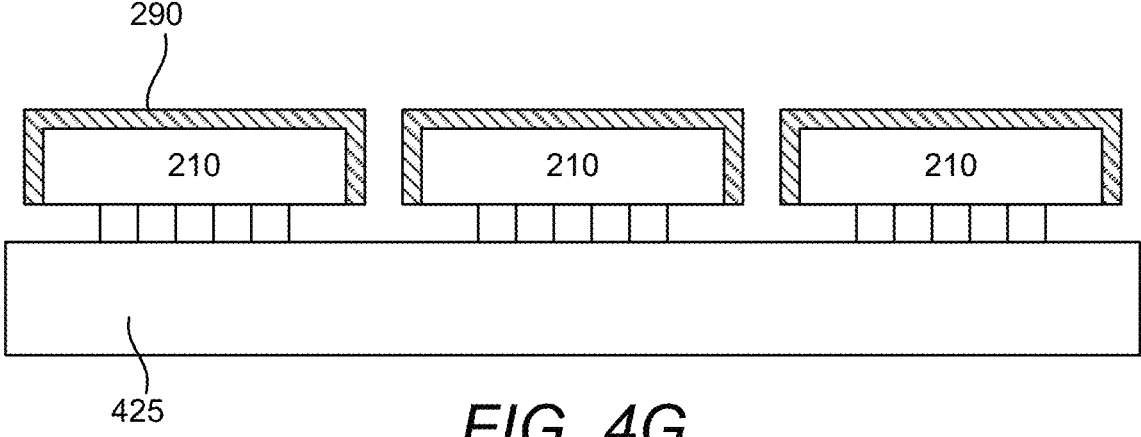

FIG. 4G illustrates a stage in which the second shield 290 may be formed as a result of the metal deposition process. Thereafter, the individual dies 210 along with the second shields 290 may be provided, e.g., in the stage illustrated in FIG. 3E.

FIG. 5 illustrates a flow chart of an example method 500 of fabricating a multi-die module, such as the multi-die module 200, in accordance with at one or more aspects of the disclosure.

In block 510, a die 210 and an adjacent die 220, 230 may be provided. The die 210 may comprise die connects 212 on a lower surface thereof. The adjacent die 220, 230 may comprise adjacent die connects 222, 232 on a lower surface thereof. In an aspect, block 510 may correspond to the stage illustrated in FIG. 3E.

In block 520, a first mold compound 240 may be formed. The first mold compound 240 may comprise a die MC part 241 and an adjacent die MC part 242, 243. The die MC part 241 may encapsulate sidewalls and an upper surface of the die 210. The adjacent die MC part 242, 243 may encapsulate sidewalls and an upper surface of the adjacent die 220, 230. A through-mold trench 285 may be formed in the first mold compound 240 between the die MC part 241 and the adjacent die MC part 242, 243. In an aspect, block 520 may correspond to the stages illustrated in FIGS. 3F-3H.

In block 530, a through-mold contact (TMC) shield 295 may be formed. Forming the first shield 295 may comprise forming a surround shield portion 296 in the through-mold trench 285 on a sidewall and on an upper surface of the die MC part 241. The first shield 295 may be formed of metal (e.g., Cu, Al, etc.). In an aspect, block 530 may correspond to the stage illustrated in FIG. 3I.

In block 540, a second mold compound 245 may be formed on the die MC part 241, on the adjacent die MC part 242, 243, and in the through-mold trench 285 on the surround shield portion 296. In an aspect, block 540 may correspond to the stage illustrated in FIG. 3J.

FIG. 6 illustrates a flow chart of an example method 800 of fabricating a multi-die module, such as the multi-die module 200 in accordance with at one or more aspects of the disclosure. FIG. 6 may be view as being more comprehensive than FIG. 5.

Block 610 may be similar to block 510. That is, in block 610, a die 210 and an adjacent die 220, 230 may be provided. The die 210 may comprise die connects 212 on a lower surface thereof. The adjacent die 220, 230 may comprise adjacent die connects 222, 232 on a lower surface thereof. In an aspect, block 610 may correspond to the stage illustrated in FIG. 3E.

In block 612, a second shield 290 may be formed on the sidewalls and the upper surface of the die 210. The second shield 290 may be formed of metal. Note that the die MC part 241 may at least partially encapsulates the second shield 290. Also, the first shield 295 may be electrically coupled to the second shield 290.

FIG. 7 illustrates a flow chart of an example process to implement block 612. In block 710, a wafer of dies 210 may be provided on a first carrier tape 415. The die connects (e.g., die bumps) may be on an opposite side of the first carrier tape 415. In an aspect, block 710 may correspond to the stage illustrated in FIG. 4A.

In block 720, the dies 210 may be singulated. In an aspect, block 720 may correspond to the stage illustrated in FIG. 4B.

In block 730, the first carrier tape 415 may be expanded such that the individual dies are separated from each other. In an aspect, block 730 may correspond to the stage illustrated in FIG. 4C.

In block 740, the second carrier tape 425 may be attached to the die connects 212 of the separated dies. In an aspect, block 740 may correspond to the stage illustrated in FIG. 4D.

In block 750, the first carrier tape 415 may be removed. In block 755, the dies 210 and the second carrier tape 425 may be flipped. In an aspect, blocks 750 and 755 correspond to the stage illustrated in FIG. 4E.

In block 760, a metal (e.g., Cu, Al, etc.) may be deposited on the sidewalls and upper surfaces of the dies 210. As a result, the second shields 290 may be formed. In an aspect, block 760 correspond to the stages illustrated in FIGS. 4F and 4G.

Referring back to FIG. 6, in block 615, a plurality of redistribution layers (RDL) 250, 260 may be formed. The plurality of RDLs may include first and second RDLs 250, 260 in which the first RDL 250 may be the lowermost RDL and the second RDL 260 may be the uppermost RDL. While not specifically included, one or more intermediate RDLs may be formed as indicated above. An upper surface of the first RDL 250 may be in direct contact with a lower surface of the first mold compound 240. Also, a lower surface of the second mold compound 245 may be within the through-mold trench 285. In an aspect, block 615 may correspond to the stages illustrated in FIGS. 3A-3D.

Block 620 may be similar to block 520. That is, in block 620, a first mold compound 240 may be formed. The first mold compound 240 may comprise a die MC part 241 and an adjacent die MC part 242, 243. The die MC part 241 may encapsulate sidewalls and an upper surface of the die 210. The adjacent die MC part 242, 243 may encapsulate sidewalls and an upper surface of the adjacent die 220, 230. A through-mold trench 285 may be formed in the first mold compound 240 between the die MC part 241 and the adjacent die MC part 242, 243. In an aspect, block 620 may correspond to the stages illustrated in FIGS. 3F-3H.

Block 630 may be similar to block 530. That is, in block 630, the first shield 295 may be formed. Forming the first shield 295 may comprise forming a surround shield portion

296 in the through-mold trench 285 on a sidewall and on an upper surface of the die MC part 241. The first shield 295 may be formed of metal (e.g., Cu, Al, etc.). In an aspect, block 630 may correspond to the stage illustrated in FIG. 3I.

In block 632, a lower shield portion 297 may be formed in the second ILD 262. The lower shield portion 297 may be physically connected with the surround shield portion 296 and may be electrically coupled with at least one second layer metal 262. For example, the lower shield portion 297 may be in direct contact with the at least one second layer metal 262. In an aspect, block 632 may correspond to the stage illustrated in FIG. 3I.

In block 635, an adjacent shield portion 297 may be formed in the through-mold trench 285 on a sidewall of the adjacent die MC part 242, 243. The adjacent shield portion 297 may also be formed at least partially on the upper surface of the adjacent die MC part 242, 243. In an aspect, block 635 may correspond to the stage illustrated in FIG. 3I.

Block 640 may be similar to block 540. That is, in block 640, a second mold compound 245 may be formed on the die MC part 241, on the adjacent die MC part 242, 243, and in the through-mold trench 285 on the surround shield portion 296. In an aspect, block 640 may correspond to the stage illustrated in FIG. 3J.

Figure 8:
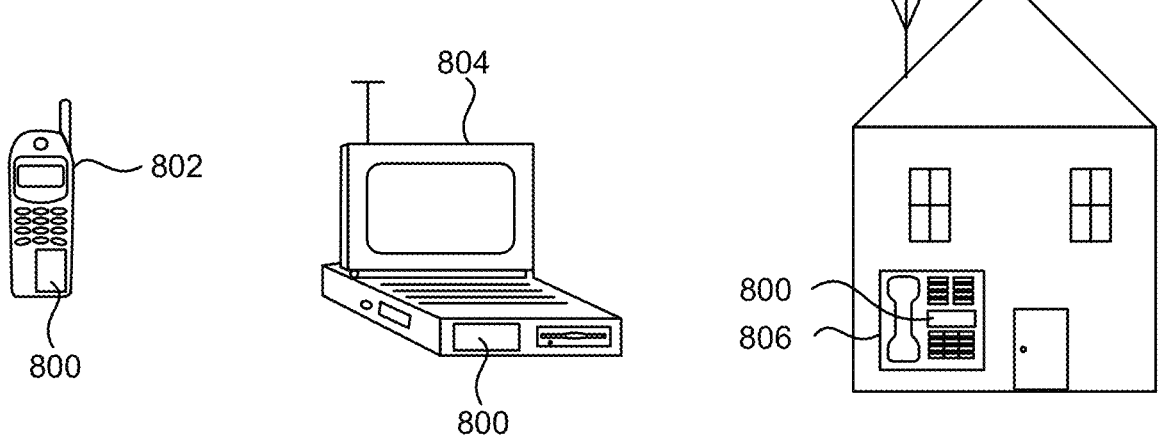
FIG. 8 illustrates various electronic devices which may utilize one or more aspects of the disclosure.

FIG. 8 illustrates various electronic devices 800 that may be integrated with any of the aforementioned multi-die module in accordance with various aspects of the disclosure.

For example, a mobile phone device 802, a laptop computer device 804, and a fixed location terminal device 806 may each be considered generally user equipment (UE) and may include one or more multi-die modules (e.g., multi-die module 200) as described herein. The devices 802, 804, 806 illustrated in FIG. 8 are merely exemplary. Other electronic devices may also include the die packages including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

The foregoing disclosed devices and functionalities may be designed and configured into computer files (e.g., RTL, GDSII, GERBER, etc.) stored on computer-readable media. Some or all such files may be provided to fabrication handlers who fabricate devices based on such files. Resulting products may include semiconductor wafers that are then cut into semiconductor die and packaged into an antenna on glass device. The antenna on glass device may then be employed in devices described herein.

Implementation examples are described in the following numbered clauses:

Clause 1: A multi-die module, comprising: a die and an adjacent die, the die comprising die connects on a lower surface thereof, and the adjacent die comprising adjacent die connects on a lower surface thereof; a first mold compound (MC) comprising a die MC part and an adjacent die MC part, the die MC part configured to encapsulate sidewalls and an upper surface of the die, the adjacent die MC part configured to encapsulate sidewalls and an upper surface of the adjacent die, a through-mold trench formed in the first mold compound between the die MC part and the adjacent die MC part; a first shield comprising a surround shield portion formed in the through-mold trench on a sidewall and on an upper surface of the die MC part, the first shield being formed of metal; and a second mold compound formed on the die MC part, on the adjacent die MC part, and in the through-mold trench on the surround shield portion.

Clause 2: The multi-die module of clause 1, wherein the first shield is configured to connect to ground voltage.

Clause 3: The multi-die module of any of clauses 1-2, further comprising: a second shield on the sidewalls and the upper surface of the die, the second shield being formed of metal, wherein the die MC part at least partly encapsulates the second shield, and wherein the first shield is electrically coupled to the second shield.

Clause 4: The multi-die module of clause 3, wherein the second shield is formed directly on the sidewalls and the upper surface of the die.

Clause 5: The multi-die module of any of clauses 3-4, wherein the first shield is in direct contact with the second shield.

Clause 6: The multi-die module of any of clauses 1-5, wherein the second mold compound is thermally conductive.

Clause 7: The multi-die module of any of clauses 1-7, further comprising: a plurality of redistribution layers (RDL) including first and second RDLs, the first RDL being the lowermost RDL and the second RDL being the uppermost RDL, an upper surface of the first RDL being in direct contact with a lower surface of the first mold compound and a lower surface of the second mold compound within the through-mold trench, wherein the first RDL comprises one or more first layer metals formed in a first interlayer dielectric (ILD), wherein the second RDL comprises one or more second layer metals formed in a second ILD, wherein the one or more first layer metals and the one or more second layer metals provide conductive paths between the die and one or more devices external to the multi-die module, or between the adjacent die and the one or more devices external to the multi-die module, or both, and wherein at least one second metal layer is electrically coupled to the first shield.

Clause 8: The multi-die module of clause 7, wherein the first shield further comprises a lower shield portion formed in the second ILD physically connected with the surround shield portion, the lower shield portion being electrically coupled with at least one second layer metal.

Clause 9: The multi-die module of clause 8, wherein the lower shield portion is in physical contact with the at least one second layer metal.

Clause 10: The multi-die module of any of clauses 1-9, wherein the first shield further comprises an adjacent shield portion formed in the through-mold trench on a sidewall of the adjacent die MC part.

Clause 11: The multi-die module of clause 10, wherein the adjacent shield portion is formed at least partially on the upper surface of the adjacent die MC part.

Clause 12: The multi-die module of any of clauses 1-11, wherein the first shield is formed from any one or more of copper (Cu) and aluminum (Al).

Clause 13: The multi-die module of any of clauses 1-12, wherein the die is a power amplifier, or wherein the adjacent die is a switch (SW) or a low noise amplifier (LNA), or both.

Clause 14: The multi-die module of any of clauses 1-13, wherein the first and second mold compounds are formed of different materials.

Clause 15: The multi-die module of any of clauses 1-14, wherein the multi-die module is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

Clause 16: A method of fabricating a multi-die module, the method comprising: providing a die and an adjacent die, the die comprising die connects on a lower surface thereof, and the adjacent die comprising adjacent die connects on a lower surface thereof; forming a first mold compound (MC) comprising a die MC part and an adjacent die MC part, the die MC part configured to encapsulate sidewalls and an upper surface of the die, the adjacent die MC part configured to encapsulate sidewalls and an upper surface of the adjacent die, a through-mold trench formed in the first mold compound between the die MC part and the adjacent die MC part; forming a first shield comprising forming a surround shield portion in the through-mold trench on a sidewall and on an upper surface of the die MC part, the first shield being formed of metal; and forming a second mold compound on the die MC part, on the adjacent die MC part, and in the through-mold trench on the surround shield portion.

Clause 17: The method of clause 16, wherein the first shield is configured to connect to ground voltage.

Clause 18: The method of any of clauses 16-17, further comprising: forming a second shield on the sidewalls and the upper surface of the die, the second shield being formed of metal, wherein the die MC part at least partly encapsulates the second shield, and wherein the first shield is electrically coupled to the second shield.

Clause 19: The method of clause 18, wherein forming the second shield comprises: providing a wafer of dies on a first carrier tape, the die connects being on an opposite side of the first carrier tape; singulating the dies; expanding the first carrier tape, the individual dies being separated from each other when the first carrier tape is expanded; attaching a second carrier tape to the die connects of the separated dies; removing the first carrier tape; flipping the dies and the second carrier tape; and depositing a metal on the sidewalls and upper surfaces of the dies.

Clause 20: The method of any of clauses 18-19, wherein the first shield is in direct contact with the second shield.

Clause 21: The method of any of clauses 16-20, wherein the second mold compound is thermally conductive.

Clause 22: The method of any of clauses 16-21, further comprising: forming a plurality of redistribution layers (RDL) including first and second RDLs, the first RDL being the lowermost RDL and the second RDL being the uppermost RDL, an upper surface of the first RDL being in direct contact with a lower surface of the first mold compound and a lower surface of the second mold compound within the through-mold trench, wherein the first RDL comprises one or more first layer metals formed in a first interlayer dielectric (ILD), wherein the second RDL comprises one or more second layer metals formed in a second ILD, wherein the one or more first layer metals and the one or more second layer metals provide conductive paths between the die and one or more devices external to the multi-die module, or between the adjacent die and the one or more devices external to the multi-die module, or both, and wherein at least one second metal layer is electrically coupled to the first shield.

Clause 23: The method of clause 22, wherein forming the first shield further comprises: forming a lower shield portion in the second ILD physically connected with the surround shield portion, the lower shield portion being electrically coupled with at least one second layer metal.

Clause 24: The method of clause 23, wherein the lower shield portion is in physical contact with the at least one second layer metal.

Clause 25: The method of any of clauses 16-24, wherein forming the first shield further comprises: forming an adjacent shield portion in the through-mold trench on a sidewall of the adjacent die MC part.

Clause 26: The method of clause 25, wherein the adjacent shield portion is formed at least partially on the upper surface of the adjacent die MC part.

Clause 27: The method of any of clauses 16-26, wherein the first shield is formed from any one or more of copper (Cu) and aluminum (Al).

Clause 28: The method of any of clauses 16-27, wherein the die is a power amplifier, or wherein the adjacent die is a switch (SW) or a low noise amplifier (LNA), or both.

Clause 29: The method of any of clauses 16-28, wherein the first and second mold compounds are formed of different materials.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described herein can be configured to perform at least a portion of a method described herein.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or one or more claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into one or more sub-actions or contain one or more sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A multi-die module, comprising:

a die and an adjacent die, the die comprising die connects on a lower surface thereof, and the adjacent die comprising adjacent die connects on a lower surface thereof;

a first mold compound (MC) comprising a die MC part and an adjacent die MC part, the die MC part configured to encapsulate sidewalls and an upper surface of the die, the adjacent die MC part configured to encapsulate sidewalls and an upper surface of the adjacent die, a through-mold trench formed in the first mold compound between the die MC part and the adjacent die MC part;

a first shield comprising a surround shield portion formed in the through-mold trench on a sidewall and on an upper surface of the die MC part, the first shield being formed of metal;

a second shield on the sidewalls and the upper surface of the die, the second shield formed of metal;

a second mold compound formed on the die MC part, on the adjacent die MC part, and in the through-mold trench on the surround shield portion;

wherein the die MC part at least partly encapsulates the second shield, and wherein the first shield is electrically coupled to the second shield.

2. The multi-die module of claim 1, wherein the first shield is configured to connect to ground voltage.

3. The multi-die module of claim 1, wherein the second shield is formed directly on the sidewalls and the upper surface of the die.

4. The multi-die module of claim 1, wherein the first shield is in direct contact with the second shield.

5. The multi-die module of claim 1, wherein the second mold compound is thermally conductive.

6. The multi-die module of claim 1, further comprising:

a plurality of redistribution layers (RDL) including first and second RDLs, the first RDL being the lowermost RDL and the second RDL being the uppermost RDL, an upper surface of the first RDL being in direct contact with a lower surface of the first mold compound and a lower surface of the second mold compound within the through-mold trench, wherein the first RDL comprises one or more first layer metals formed in a first interlayer dielectric (ILD), wherein the second RDL comprises one or more second layer metals formed in a second ILD, wherein the one or more first layer metals and the one or more second layer metals provide conductive paths between the die and one or more devices external to the multi-die module, or between the adjacent die and the one or more devices external to the multi-die module, or both, and wherein at least one second metal layer is electrically coupled to the first shield.

7. The multi-die module of claim 6, wherein the first shield further comprises a lower shield portion formed in the second ILD physically connected with the surround shield portion, the lower shield portion being electrically coupled with at least one second layer metal.

8. The multi-die module of claim 7, wherein the lower shield portion is in physical contact with the at least one second layer metal.

9. The multi-die module of claim 1, wherein the first shield further comprises an adjacent shield portion formed in the through-mold trench on a sidewall of the adjacent die MC part.

10. The multi-die module of claim 9, wherein the adjacent shield portion is formed at least partially on the upper surface of the adjacent die MC part.

11. The multi-die module of claim 1, wherein the first shield is formed from any one or more of copper (Cu) and aluminum (Al).

12. The multi-die module of claim 1, wherein the die is a power amplifier, or wherein the adjacent die is a switch (SW) or a low noise amplifier (LNA), or both.

13. The multi-die module of claim 1, wherein the first and second mold compounds are formed of different materials.

14. The multi-die module of claim 1, wherein the multi-die module is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

15. A method of fabricating a multi-die module, the method comprising:

providing a die and an adjacent die, the die comprising die connects on a lower surface thereof, and the adjacent die comprising adjacent die connects on a lower surface thereof;

forming a first mold compound (MC) comprising a die MC part and an adjacent die MC part, the die MC part configured to encapsulate sidewalls and an upper surface of the die, the adjacent die MC part configured to encapsulate sidewalls and an upper surface of the adjacent die, a through-mold trench formed in the first mold compound between the die MC part and the adjacent die MC part;

forming a first shield comprising forming a surround shield portion in the through-mold trench on a sidewall and on an upper surface of the die MC part, the first shield being formed of metal;

forming a second shield on the sidewalls and the upper surface of the die, the second shield being formed of metal;

forming a second mold compound on the die MC part, on the adjacent die MC part, and in the through-mold trench on the surround shield portion;

wherein the die MC part at least partly encapsulates the second shield, and wherein the first shield is electrically coupled to the second shield.

16. The method of claim 15, wherein the first shield is configured to connect to ground voltage.

17. The method of claim 15, wherein forming the second shield comprises:

providing a wafer of dies on a first carrier tape, the die connects being on an opposite side of the first carrier tape;

singulating the dies;

expanding the first carrier tape, the individual dies being separated from each other when the first carrier tape is expanded;

attaching a second carrier tape to the die connects of the separated dies;

removing the first carrier tape;

flipping the dies and the second carrier tape; and depositing a metal on the sidewalls and upper surfaces of the dies.

18. The method of claim 7, wherein the first shield is in direct contact with the second shield.

19. The method of claim 15, wherein the second mold compound is thermally conductive.

20. The method of claim 15, further comprising:

forming a plurality of redistribution layers (RDL) including first and second RDLs, the first RDL being the lowermost RDL and the second RDL being the uppermost RDL, an upper surface of the first RDL being in direct contact with a lower surface of the first mold compound and a lower surface of the second mold compound within the through-mold trench, wherein the first RDL comprises one or more first layer metals formed in a first interlayer dielectric (ILD), wherein the second RDL comprises one or more second layer metals formed in a second ILD, wherein the one or more first layer metals and the one or more second layer metals provide conductive paths between the die and one or more devices external to the multi-die module, or between the adjacent die and the one or more devices external to the multi-die module, or both, and wherein at least one second metal layer is electrically coupled to the first shield.

21. The method of claim 20, wherein forming the first shield further comprises:

forming a lower shield portion in the second ILD physically connected with the surround shield portion, the lower shield portion being electrically coupled with at least one second layer metal.

22. The method of claim 21, wherein the lower shield portion is in physical contact with the at least one second layer metal.

23. The method of claim 15, wherein forming the first shield further comprises:

forming an adjacent shield portion in the through-mold trench on a sidewall of the adjacent die MC part.

24. The method of claim 23, wherein the adjacent shield portion is formed at least partially on the upper surface of the adjacent die MC part.

25. The method of claim 15, wherein the first shield is formed from any one or more of copper (Cu) and aluminum (Al).

26. The method of claim 15, wherein the die is a power amplifier, or wherein the adjacent die is a switch (SW) or a low noise amplifier (LNA), or both.

27. The method of claim 15, wherein the first and second mold compounds are formed of different materials.

* * * * *